(12) United States Patent
Cooper et al.

(10) Patent No.: US 12,635,069 B2
(45) Date of Patent: May 19, 2026

(54) PROGRAMMABLE CIRCUIT BOARD AND METHOD OF USE

(71) Applicant: Artisan Insight, Inc., San Francisco, CA (US)

(72) Inventors: Ashley Cooper, San Francisco, CA (US); Mattis Fjällström, San Francisco, CA (US); Alex Withrow, San Francisco, CA (US)

(73) Assignee: Itera, Inc., San Francisco, CA (US)

( * ) Notice: Subject to any disclaimer, the term of this patent is extended or adjusted under 35 U.S.C. 154(b) by 0 days.

(21) Appl. No.: 19/262,476

(22) Filed: Jul. 8, 2025

(65) Prior Publication Data

US 2026/0025915 A1     Jan. 22, 2026

Related U.S. Application Data

(60) Provisional application No. 63/672,915, filed on Jul. 18, 2024, provisional application No. 63/784,789, filed on Apr. 7, 2025.

(51) Int. Cl.
H05K 1/02 (2006.01)

(52) U.S. Cl.
CPC ................................. H05K 1/0286 (2013.01)

(58) Field of Classification Search
CPC .... H05K 1/028; H05K 1/0287; H05K 1/0289; H05K 1/029; H05K 1/0292

USPC .......................................................... 174/261
See application file for complete search history.

(56) References Cited

U.S. PATENT DOCUMENTS

| | | | |
|---|---|---|---|
| 7,053,323 | B1 | 5/2006 | Beerling |
| 2002/0114715 | A1 | 8/2002 | Yoon et al. |
| 2010/0025242 | A1 | 2/2010 | Pamula et al. |
| 2017/0326524 | A1 | 11/2017 | Hadwen et al. |
| 2020/0296825 | A1 | 9/2020 | Ozdoganlar et al. |

OTHER PUBLICATIONS

Cui, et al., "Island-ground single-plate electro-wetting on dielectric device for digital microfluidic systems", Applied Physics Letters 105, 013509 (2014); doi: 10.1063/1.4889895.

*Primary Examiner* — Tremesha W Burns
(74) *Attorney, Agent, or Firm* — Jeffrey Schox; Samuel Rosenthal

(57) ABSTRACT

A programmable circuit board, preferably including: a rig, a reservoir, and working metal, wherein the rig preferably includes a set of unit cells cooperatively defined by a stack of substrates and a set of driver elements. A method for dynamically programming a circuit board, preferably including: receiving a circuit board design; determining a unit cell map; positioning working metal; optionally assembling a remainder of circuit board components; optionally testing the assembled PCB analog; and/or optionally updating the physical PCB analog configuration.

20 Claims, 6 Drawing Sheets

90

PROGRAMMABLE CIRCUIT BOARD AND METHOD OF USE

CROSS-REFERENCE TO RELATED APPLICATIONS

This application claims the benefit of U.S. Provisional Application No. 63/672,915, filed 18 Jul. 2024, and of U.S. Provisional Application No. 63/784,789, filed 7 Apr. 2025, each of which is herein incorporated in its entirety by this reference.

TECHNICAL FIELD

This invention relates generally to the electronics design field, and more specifically to a new and useful programmable circuit board and method of use in the electronics design field.

DETAILED DESCRIPTION OF THE INVENTION

The following description of the preferred embodiments of the invention is not intended to limit the invention to these preferred embodiments, but rather to enable any person skilled in the art to make and use this invention.

1. Overview

Figure 1:
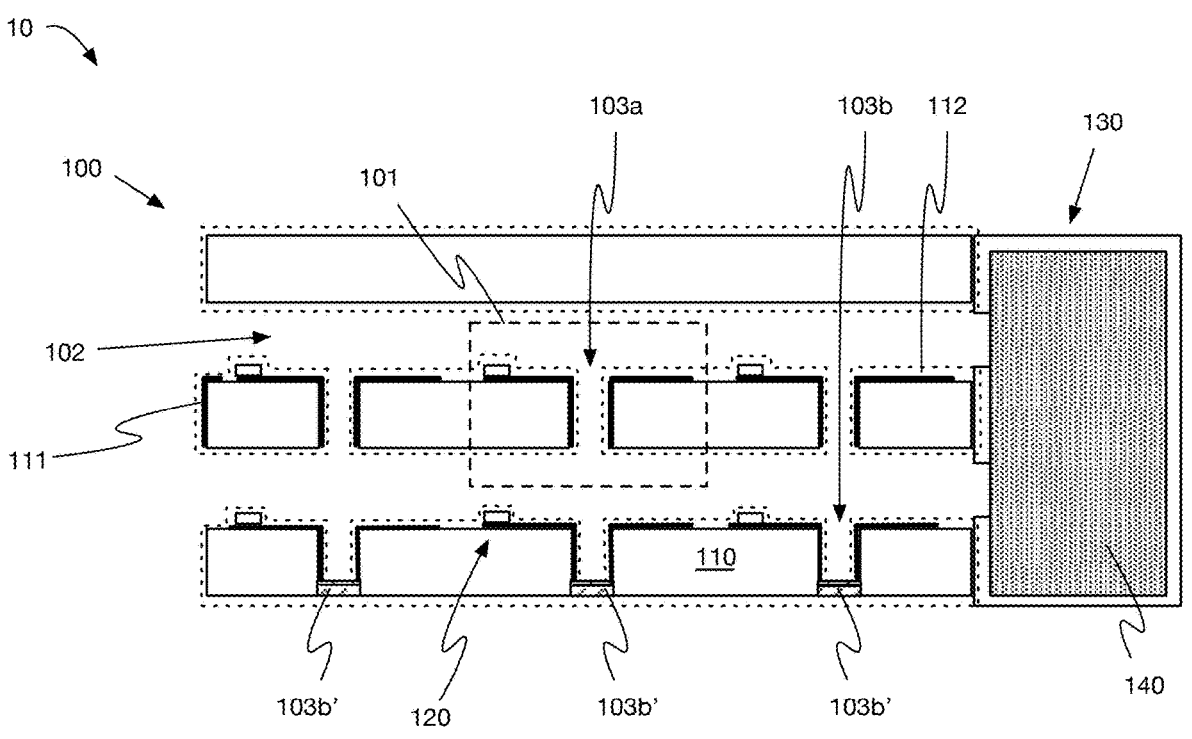
FIG. 1 is a schematic representation of a side cutaway view of a variant of the programmable circuit board.
Figure 9:
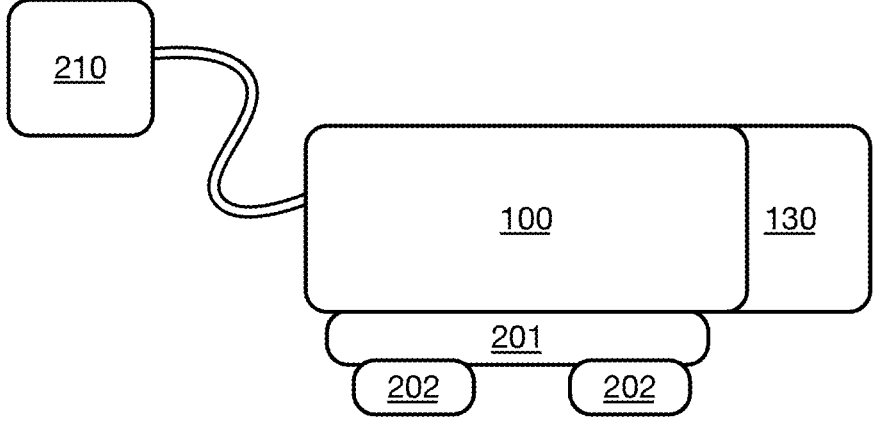
FIG. 9 is a schematic representation of a variant of the programmable circuit board and associated elements.

As shown in FIG. 1, in variants, the programmable circuit board 10 can include a rig 100, including a set of unit cells 101 cooperatively defined by a stack of substrates no and a set of driver elements 120; a reservoir 130 fluidly connected to the set of unit cells; and working metal 140 retained within the reservoir. In operation, droplets 140' of the working metal are selectively drawn to a subset of the unit cells to cooperatively define a set of circuit traces. The programmable circuit board (dynamically programmable circuit board (DPCB)) can optionally be used with or include: a conductive layer 201, electronic components 202, a set of one or more controllers 210, and/or other components (e.g., as shown by way of examples in FIG. 2 and/or FIG. 9). The DPCB can optionally include one or more vias 103 (e.g., through-hole vias 103a and/or blind vias 103b)

defined therein. The programmable circuit board functions to dynamically and reversibly define printed circuit board (PCB) analogs 300.

Figure 8:
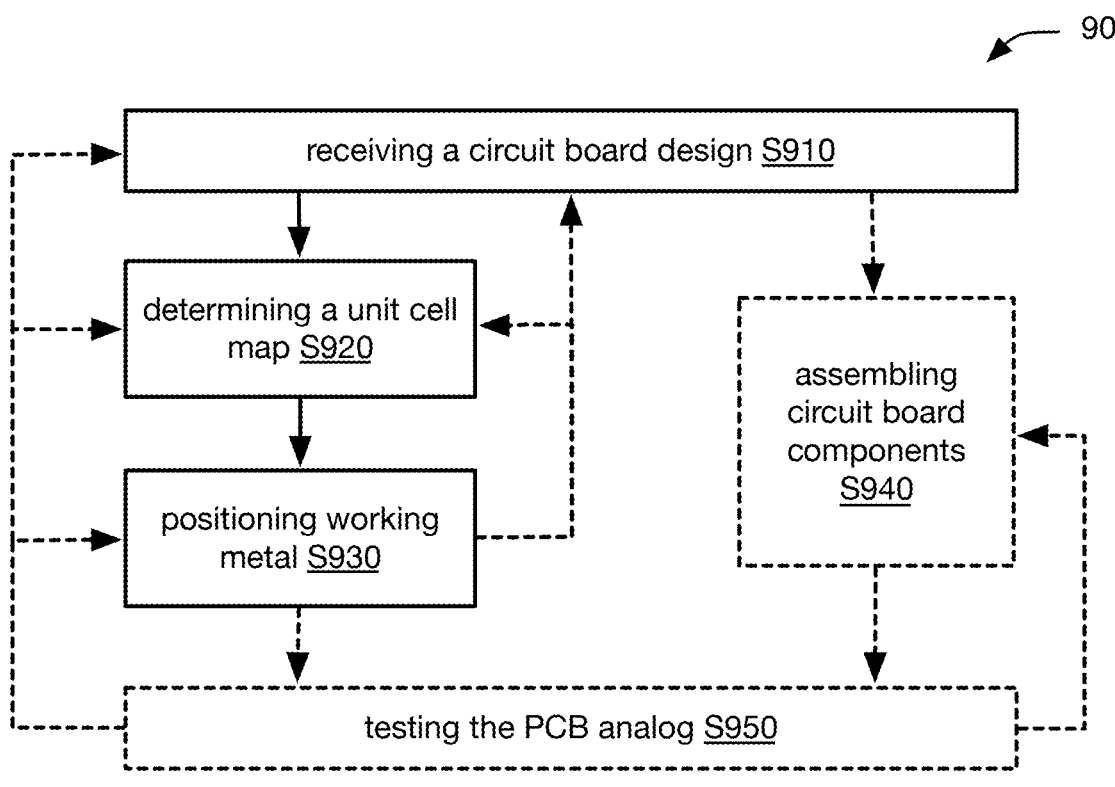
FIG. 8 is a schematic representation of a variant of a method for dynamically programming a circuit board.

As shown in FIG. 8, in variants, a method 90 for dynamically programming a circuit board can include: receiving a circuit board design S910; determining a unit cell map S920 (e.g., pixelating the traces in the circuit board design to identify target unit cell positions); positioning working metal S930 (e.g., positioning based on the unit cell map, preferably positioning a droplet of working metal within each target unit cell position); optionally assembling a remainder of the circuit board components S940; optionally testing the assembled PCB analog S950; and/or optionally updating (e.g., dynamically updating) the physical PCB analog configuration (e.g., by repeating any or all of the prior steps).

Figure 2:
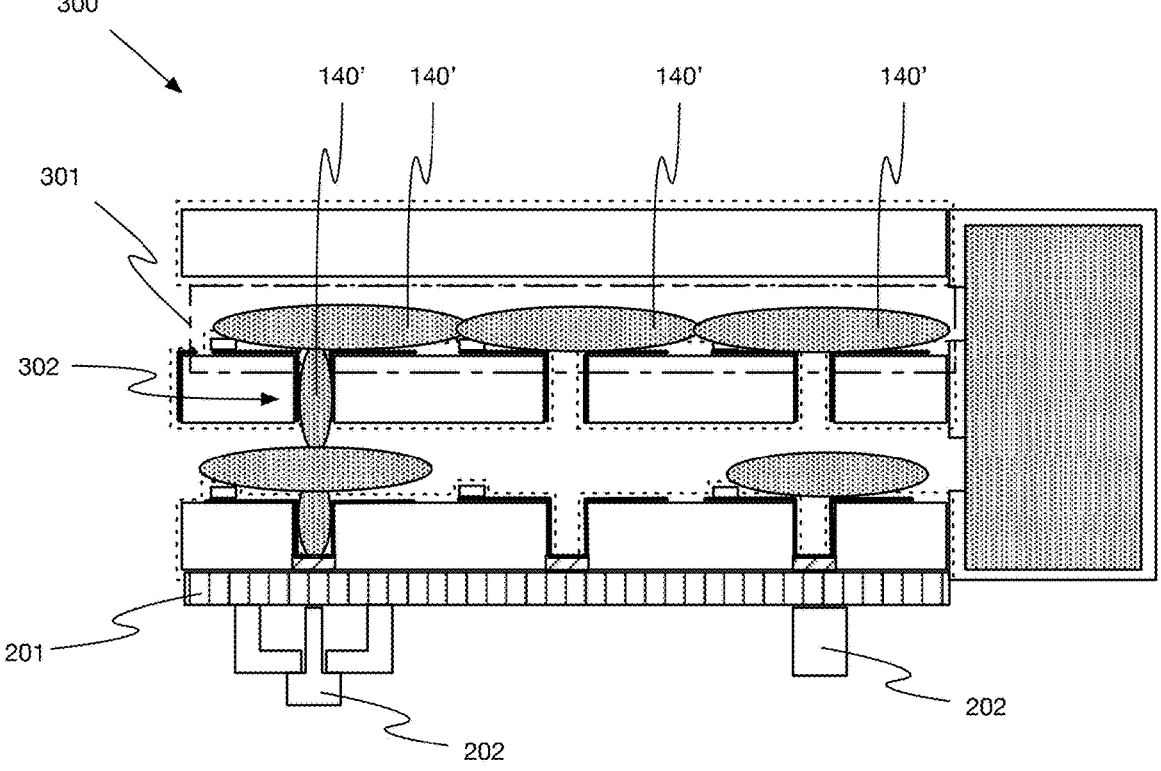
FIG. 2 is an illustrative example of a side cutaway view of an example printed circuit board (PCB) analog formed using the programmable circuit board.
Figure 3:
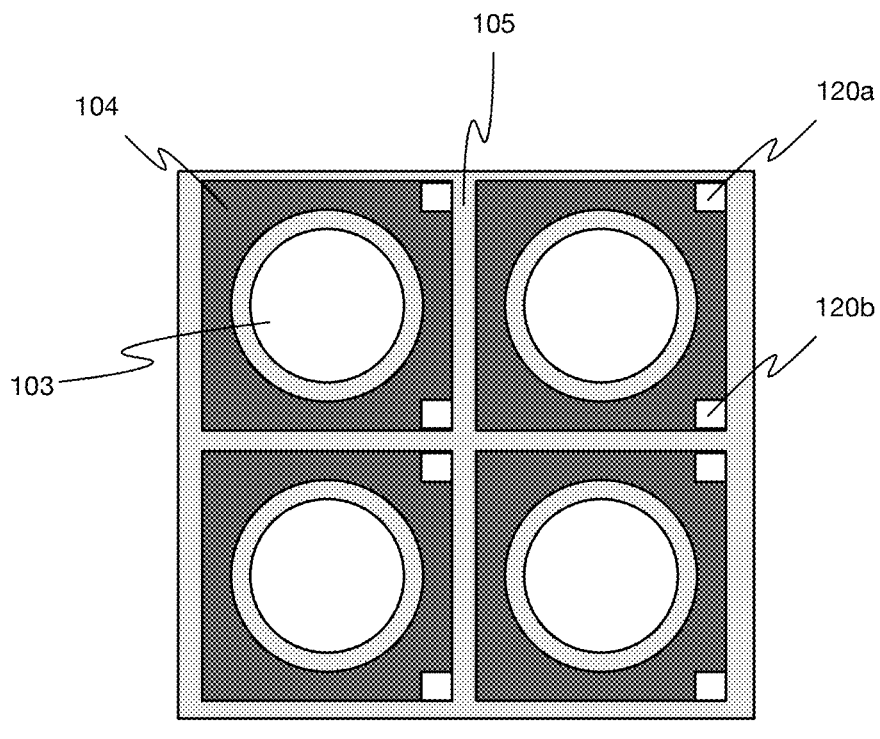
FIG. 3 is a schematic representation of a top-down view of a variant of a substrate, defining multiple unit cells.
Figure 4:
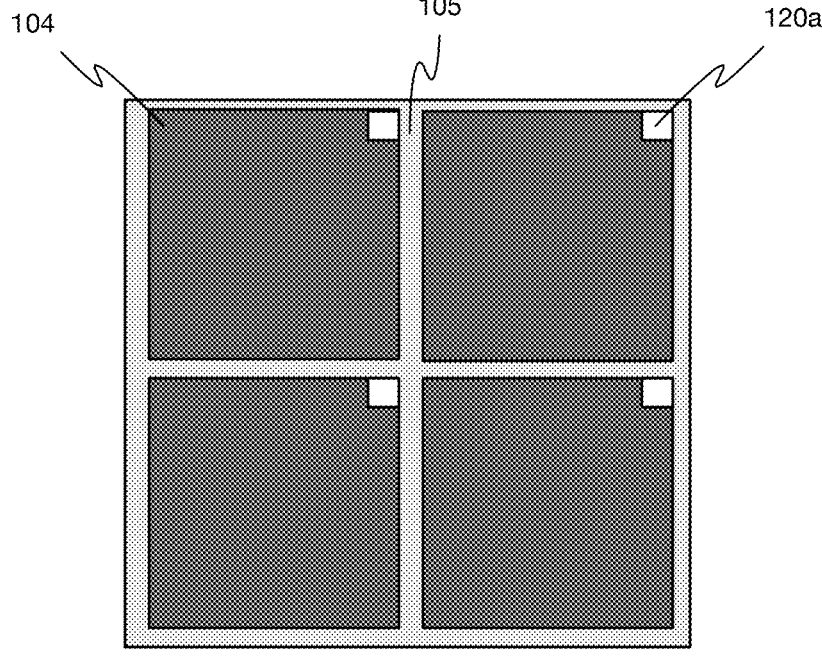
FIG. 4 is a schematic representation of a top-down view of a second variant of a substrate, defining multiple unit cells

In an illustrative example, the programmable circuit board includes a rig including an array (e.g., regular array, such as a 2D matrix or 3D matrix; regular or irregular stack of regular 2D arrays, such as a stack of identical or substantially identical 2D arrays with registration errors between the stacked arrays, a stack of dissimilar 2D arrays, etc.; irregular array such as an irregular 2D array or irregular 3D array; etc.) of unit cells cooperatively defined by a stack of substrates; a set of driver elements (e.g., FETs, TFTs, etc.), each assigned to a different unit cell of the matrix; a set of drive lines extending through the body of a substrate and electrically connecting the driver elements to a set of controllers; a reservoir fluidly connected to the unit cells; and a working metal contained within the reservoir. In some specific examples, a stack of layers can exhibit some registration error (e.g., sub-pixel, single pixel, multiple pixel, etc.) between the planar arrays of the different layers; in such specific examples, the method preferably includes determining this registration error (e.g., before performing S920 and/or S930) and/or compensating for this registration error (e.g., when performing S920 and/or S930). The stack of substrates can include an upper outer substrate, a lower outer substrate, and a set of intermediate substrates arranged therebetween. One or more of the intermediate substrates can define an array of vias extending therethrough. Each unit cell includes: an upper substrate segment, an intermediate substrate segment including a via, a lower substrate segment, a pixel driver element configured to control working metal positioning along a broad face of the intermediate substrate segment, and a via driver element configured to control working metal flow within the via. In variants, an outer substrate (e.g., the uppermost or lowermost substrate in the stack) can optionally include a grid of blind vias (e.g., wherein the vias are capped along the external face). In these variants, the DPCB can optionally include or be used with an anisotropic conductive layer, which can be used to attach other electronic components, such as surface mount components or through-hole components (e.g., using an interposer), to the conductive paths (e.g., defined by one or more trace analogs 301 and/or via analogs 302) within the DPCB. An example is shown in FIG. 2.

Figure 6:
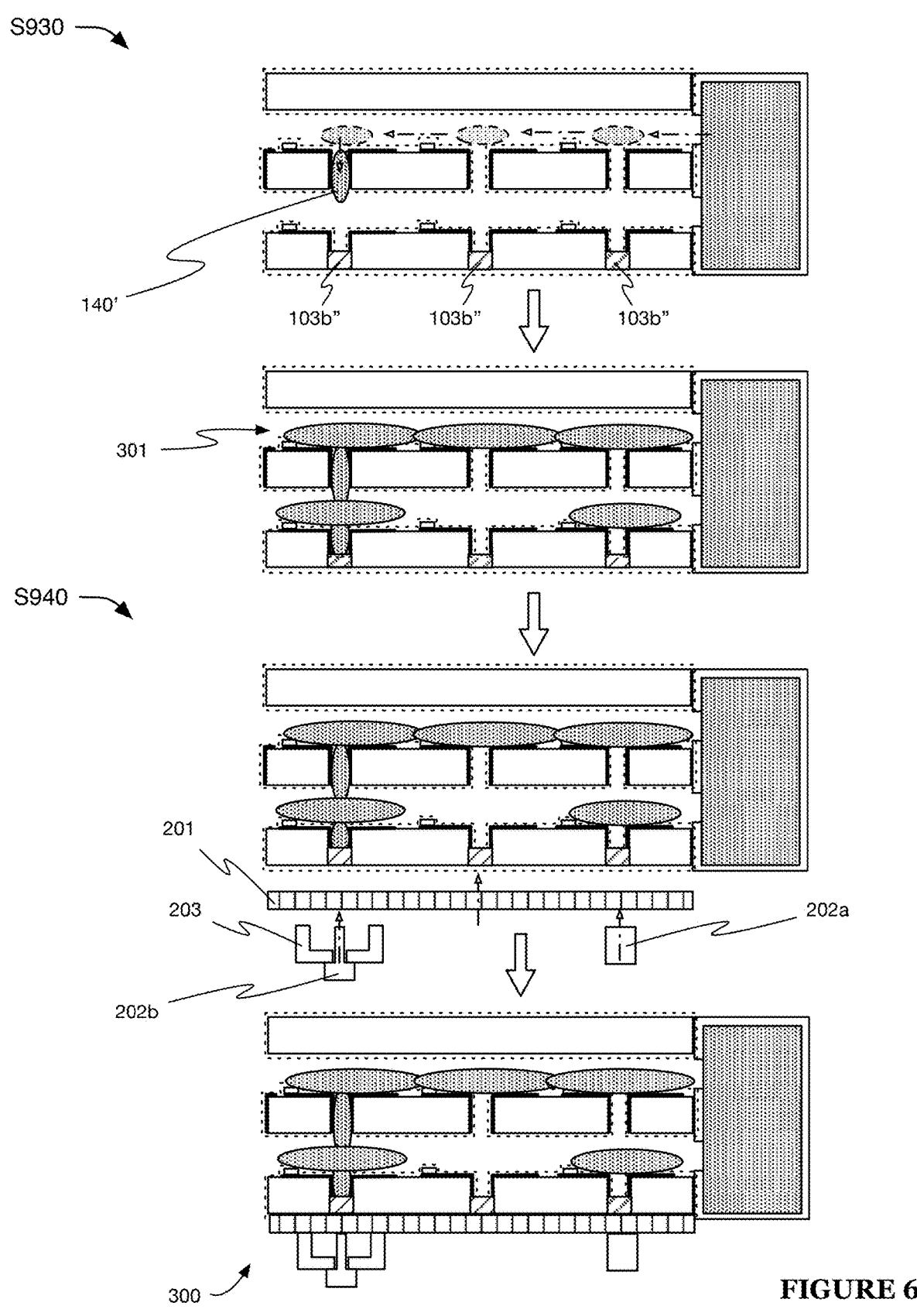
FIG. 6 is an illustrative example of forming a PCB analog.

In an illustrative example of DPCB operation, droplets of the working metal can be selectively moved to target unit cell array positions (e.g., by selectively applying electric fields to sequentially adjacent unit cells in a planned droplet path until a target position is reached, such as applying electric fields to control EWOD and/or other electrowetting of the droplet) to collectively form analogs of PCB traces. For example, the method and/or any suitable elements thereof (e.g., S930) can be repeated until a series of contiguous droplets in adjacent unit cells is formed, wherein the series of contiguous droplets cooperatively define a trace, and droplets extending through a via define an inter-layer connection. In variants, the DPCB and/or the working metal (or any suitable portions thereof) can be heated above the working metal melting point during PCB analog setup, and the DPCB can be frozen (e.g., cooled below the working metal melting point) once the PCB trace analogs are formed. Once the PCB analog is formed (e.g., with or without cooling the DPCB), the electric fields retaining the droplets can be removed. The resultant circuit board analog can then be tested (e.g., using conventional methodologies and/or equipment), wherein circuit outputs can be read at the unit cells (e.g., by the driver elements), at the surface (e.g., using the conductive layer), from a connector (e.g., USB, ethernet, etc.; connected to the circuit board at the conductive layer or through a direct connection to a filled unit cell); from a mounted component; or otherwise obtained. An example is shown in FIG. 6.

The programmable circuit board is preferably operable to perform and/or be used in performance of the method for dynamically programming a circuit board, but can additionally or alternatively be operable to perform and/or be used in performance of any other suitable methods. The method for dynamically programming a circuit board is preferably performed by and/or using the programmable circuit board, but can additionally or alternatively be performed by and/or using any other suitable system(s).

However, the programmable circuit board can additionally or alternatively include any other suitable elements in any suitable arrangement, and/or the method can additionally or alternatively include any other suitable elements performed in any suitable manner.

As used herein, the term 'dynamic' (such as in "dynamically programmable circuit board" and/or "dynamically programming a circuit board") does not necessarily indicate reconfiguration (e.g., reprogramming) and/or reconfigurability while the circuit board is in use (e.g., in use as a device-under-test (DUT), in use as one or more circuits into which it has been configured, etc.). Rather, the term 'dynamic' can additionally or alternatively indicate the ability to reconfigure the DPCB multiple times (e.g., an arbitrary number of times; a number of times limited by DPCB degradation and/or maintenance concerns, such as rather than by factors such as a limited supply of reconfiguration resources and/or an inability to cycle individual pixels between different states; etc.). However, in some variants, the DPCB may be reconfigurable while in use (e.g., as a DUT, etc.) and/or reconfigurable at any other suitable times.

2. Technical Advantages

Variants of the technology can confer one or more advantages over conventional technologies.

First, variants of the technology can enable faster, less expensive, and/or less environmentally damaging PCB prototyping. Instead of waiting for static prototypes of new PCB designs to be fabricated and shipped, which can take on the order of weeks or months, the dynamically programmable circuit board can prototype new PCB designs on the order of minutes or hours by selectively moving droplets to different positions within the rig. Additionally or alternatively, rather than requiring fabrication of several iterations of PCB designs, which can not only further increase overall design timelines (e.g., due to the need to wait for several iterations of PCB fabrication and shipping), but can additionally or alternatively lead to high costs and/or environmental impacts (e.g., due to the fabrication and shipping of multiple prototype PCBs).

Second, variants of the technology can additionally or alternatively enable PCB prototyping, testing, and design to be fully remote. Since the DPCB is a direct analog of the PCB, the DPCB can produce same or similar test results as the PCB when tested using the same tests. In a first example, the PCB design can be sent to a remote facility, wherein the remote facility can create and run tests on the DPCB analog of the PCB design, wherein the test results can be returned to the user. In another example, physical connections (e.g., USB, Ethernet, etc.) and results can be simulated on the user's local machine. In another example, a physical connector (e.g., USB, Ethernet) can be physically connected to the DPCB analog, wherein the user can connect to the DPCB analog via the physical connector (e.g., indirect connection mediated by a local device receiving the connector signals, such as wherein the user can SSH into the local device).

However, further advantages can additionally or alternatively be conferred by variants of the system and/or method disclosed herein.

3. System

As shown in FIG. 1, in variants, the programmable circuit board can include a rig, including a set of unit cells cooperatively defined by a stack of substrates and a set of driver elements; a reservoir fluidly connected to the set of unit cells; and working metal retained within the reservoir. The programmable circuit board functions to dynamically and reversibly model printed circuit board analogs.

The rig functions to provide the physical components that define the PCB analog. The rig can include a set of unit cells cooperatively defined by a stack of substrates and a set of driver elements, or be otherwise configured. The system preferably includes a single rig, but can additionally or alternatively include multiple rigs (e.g., fluidly connected to the same reservoir, operably connected to the same controller, etc.).

The substrate stack functions to define a set of unit cells therebetween, wherein the working metal can flow through a manifold 102 to each of a set of target unit cell positions that collectively form an analog of a PCB trace. The substrate stack can also define working metal wetting behaviors, anchor the driver elements, define physical delineations between unit cells, and/or perform other functionalities.

The substrate stack can include one or more substrates. The substrate of the rig functions to define portions of the unit cell, control the wetting behaviors of the working metal, and provide other functionalities.

The substrates can be arranged in parallel (e.g., with broad faces in parallel), but can alternatively be arranged in series, or in any other suitable configuration. Different substrates in the stack can have the same or different dimensions (e.g., length, width, thickness, etc.). In examples, the substrates can have a thickness of 0.1-2 mm (e.g., 0.1, 0.2, 0.3, 0.5, 0.7, 1, 1.5, 2, 0.1-0.2, 0.2-0.3, 0.3-0.5, 0.5-0.7, 0.7-1, 1-1.5, and/or 1.5-2 mm, etc.), but can additionally or alternatively have a thickness greater than 2 mm (e.g., 3, 5, 10, 2-3, 3-5, 5-10, and/or greater than 10 mm, etc.) and/or less than 0.1 mm (e.g., 10, 20, 35, 50, 70, 10-20, 20-35, 35-50, 50-70, 70-100, and/or less than 10 μm, etc.). The substrates can be coextensive, offset, and/or arranged in any other suitable manner.

The substrate can be: plastic (e.g., polyimide, polyethylene naphthalate, polyethylene terephthalate, polycarbonate, transparent polyamide, cyclic olefin polymer, etc.), glass (e.g., borosilicate glass, aluminosilicate glass, alkali-aluminosilicate glass, soda-lime glass, Corning Gorilla Glass, AGC Dragontrail Glass, etc.), ceramic (e.g., alumina, yttria-stabilized zirconia, magnesium aluminate spinel, aluminum oxynitride, silica such as fused silica or quartz, glass-ceramics such as CERAN or ZERODUR, etc.), silicon, and/or made from any other suitable material. The substrate can be manufactured using thin-film deposition, lamination, additive manufacturing processes, melt-forming processes (e.g., float, fusion draw, slot draw, etc.), and/or other processes. The substrates within the stack can include the same or different material (e.g., glass outer substrates with a plastic intermediate layer).

The substrate can be coated (e.g., examples shown in FIG. 1, FIG. 2, FIG. 3, and FIG. 4), or uncoated. The coating can include one or more layers (e.g., discrete layers, graded composition layers, etc.). The coating(s) can include one or more conductive coatings 111, dielectric coatings 112, and/or any other suitable coatings. The coating(s) can extend over the driver elements, below the driver elements, and/or with any other configuration relative to the driver elements. The substrate coating and/or layers thereof is preferably a dielectric, but can alternatively be any other coating. Examples of the substrate coating can include: hafnium oxide (e.g., $HfO_2$), tantalum oxide (e.g., $Ta_2O_5$), barium strontium titanate, silicon nitride, LiF, NaF, $Al_2O_3$, $SiO_2$, $Si_3N_4$, MgO, other dielectrics used in LED or OLED displays, ITO, plating, filling, and/or any other suitable coating material.

The conductive coating(s) 111 can include: one or more transparent conducting oxides (TCOs), such as indium tin oxide (ITO), fluorine-doped tin oxide (FTO), aluminum-doped zinc oxide (AZO), etc., and/or combinations thereof; other transparent conductive materials; metal nitrides, such as titanium nitride, tantalum nitride, zirconium nitride, hafnium nitride, vanadium nitride, etc., and/or combinations thereof; metals such as titanium, copper, and/or titanium-copper alloys; and/or any other suitable conductive materials. In some examples, the sheet resistance of the conductive material is preferably greater than a threshold value (e.g., less than 200, 200, 500, 1000, 1500, 2000, 3000, 4000, 5000, 10,000, 100-200, 200-500, 500-1000, 1000-1500, 1500-2500, 2000-3000, 3000-5000, 5000-10,000, or greater than 10,000 $\Omega$/sq, etc.), such as to provide superior radio frequency (RF) transparency. However, the conductive coating(s) can additionally or alternatively include any other suitable materials having any suitable characteristics.

The dielectric coating(s) 112 can include: hafnium oxide (e.g., $HfO_2$), tantalum oxide (e.g., $Ta_2O_5$), barium strontium titanate, silicon nitride, LiF, NaF, $Al_2O_3$, $SiO_2$, $Si_3N_4$, MgO, other dielectrics used in LED or OLED displays, and/or any other suitable dielectric materials. One or more layers of the coating can extend across the entirety of the substrate broad face(s), only along portions of the substrate faces (e.g., working metal regions; unit cell regions; etc.), and/or along any other portion of the substrate. The coating material can be selected based on the initial liquid metal droplet contact angle, the liquid metal contact angle hysteresis, the dielectric capacitance, and/or any other parameter. The dielectric can be deposited (and/or otherwise fabricated) using atomic layer deposition (ALD), chemical vapor deposition (CVD), physical vapor deposition (PVD) such as sputtering, doping (e.g., using doped dielectrics), printing, spray coating, and/or any other suitable deposition method. The dielectric can be configured in different ways to achieve desired properties. For example, the thickness of the dielectric layer can be adjusted to modify the capacitance of the capacitor defined at the unit cell (e.g., defined by the dielectric layer, one or more conductive materials embedded under the dielectric layer, and optionally a working metal droplet); in examples, the dielectric layer can have a thickness of about: 10, 20, 30, 50, 75, 100, 125, 150, 200, 250, 300, 400, 500, 750, 1000, less than 10, 10-20, 20-50, 30-75, 75-125, 100-150, 150-200, 200-300, 300-500, 500-1000, and/or greater than 1000 nm, preferably wherein leakage across the dielectric layer is negligible (e.g., to operation of the DPCB to position the working metal, to use of the configured DPCB as a PCB analog, etc.), such as wherein no or minimal pinholes through the dielectric layer are present. The surface roughness of the dielectric can be controlled to influence the contact angle and contact angle hysteresis of liquid droplets. However, the dielectric can be otherwise configured.

In a specific example, the substrate can include: glass coated with a TCO (e.g., ITO), wherein a driver element (e.g., including one or more TFTs and/or other electrical devices) is arranged on (e.g., defined on, deposited on, etc.) the glass substrate (e.g., such that the driver element, such as one or more TFT terminals thereof, is electrically connected to the TCO) and a dielectric coats the substrate, the driver element, and/or the TCO.

In variants, the system can include two or more outer substrates (e.g., an upper outer substrate and a lower outer substrate). In variants, the system can include zero, one, or more intermediate substrates. Alternatively, the system can include any other suitable number and/or arrangement of substrates.

The outer substrates function to define the outer boundaries of the rig, and can function as an interface between the traces within the DPCB and the external environment. The outer substrates can form the top and bottom of the substrate stack, but can alternatively form any other suitable portion of the system. In a first example, the outer substrate can include no vias (e.g., can be smooth or substantially smooth). In a second example, the outer substrate can define blind vias 103b. The blind vias preferably define an entry aperture (e.g., at a surface of the substrate, such as at the inner face of the outer substrate), a terminal (e.g., within the substrate, preferably between the inner and outer faces of the substrate; preferably substantially parallel to the entry aperture and the faces of the substrate), and a sidewall (e.g., cylindrical sidewall, conical sidewall, rectilinear sidewall, pyramidal sidewall, etc.) that extends from the entry aperture to the terminal, wherein the volume of the blind via is bounded by the entry aperture, the terminal, and the sidewall. The blind vias are preferably capped along the exterior surface (e.g., wherein the blind vias are fabricated by drilling through the substrate and then capping the resulting via along the exterior surface), wherein the via has an opening (entry aperture) on the inner face of the substrate and is sealed along the outer face of the substrate (e.g., by a cap 103b', such as a conductive cap 103b", wherein the cap defines a terminal pad that bounds the via), but can be otherwise capped (or can include no such cap, such as wherein the via terminates within the substrate at substrate that remains after drilling of the blind via). The blind vias can be capped with a conductive material (e.g., copper, gold, tantalum, etc.), be capped with glass, be capped with a material having anisotropic conductors (e.g., vertically aligned and laterally insulated), and/or be capped with any other material. The cap material (and any other materials that may contact the working metal) is preferably compatible with (e.g., not reactive with, not dissolved by, etc.) the working metal (e.g., in both solid and liquid form), but can additionally or alternatively be any other suitable material. The blind vias are preferably arranged in a grid, but can alternatively be arranged in any other suitable pattern (e.g., regular or irregular array, such as a planar array). The blind vias are preferably aligned with the other vias in the rig (e.g., aligned with the vias defined in an intermediate substrate), but can alternatively be offset or be otherwise arranged. The number of blind vias is preferably the same as the number of vias in an intermediate substrate layer, but can alternatively be more or less. However, the outer substrates can be otherwise configured.

In an illustrative example, the upper outer substrate can be smooth with no vias, while the lower outer substrate has blind vias capped along the outer face (e.g., example shown in FIG. 1). The lower substrate's via grid spacing can be substantially the same as the intermediate substrate's vias, but can alternatively have any other suitable grid spacing. In a second illustrative example, both the upper and lower outer substrates can include blind vias, wherein the blind vias are capped on the respective exterior surface.

However, the outer substrates can be otherwise configured.

The intermediate substrates are arranged between the outer substrates in the substrate stack and function to segment the volume between the outer substrates into layers of fluid manifolds. The substrate stack can include one or more intermediate substrates. The intermediate substrates preferably extend along the entire length and width of the outer substrates, but can alternatively only extend partway. Different intermediate substrates can have the same or different parameters from each other (e.g., material, dimensions, features, etc.). The intermediate substrates can have the same or different parameters from the outer substrates. In an example, the substrate stack can include one or more intermediate substrates and arranged in parallel, wherein the intermediate substrates have the same set of parameters as the outer substrates.

In a first variant, an intermediate substrate can define a set of through-hole vias 103*a*. The vias can be drilled, patterned, and/or formed in any other suitable manner. The vias are preferably arranged in a regular grid along the intermediate substrate (e.g., examples shown in FIG. 1 and FIG. 3), but can alternatively be arranged in a predetermined pattern (e.g., spiral, concentric circles, etc.) or in any other pattern. The vias can be coated with dielectric (e.g., the same dielectric as the substrate, a different dielectric from the substrate, etc.), conductive material (e.g., copper, gold, carbon nanotubes, etc.), and/or any other material.

In a second variant, an intermediate substrate can be smooth and unbroken (e.g., solid), with no vias or features.

However, the intermediate substrate can be otherwise configured.

In variants, the substrate stack can include a set of retention mechanisms that function to retain a working metal droplet within the unit cell. The retention mechanisms are preferably passive, such that the retention mechanism retains the working metal when the driver elements are turned off, but can alternatively be active (e.g., applied voltage, etc.). The retention mechanisms can leverage: surface tension, intermolecular forces (e.g., hydrogen bonds, Van der Waals forces, dipole-dipole interactions, etc.), physical retention (e.g., retaining the droplet in a trough), and/or other retention methods. The retention mechanisms can include: surface coatings (e.g., dielectrics) that control the surface tension of a working metal droplet (e.g., to prevent droplet wicking, to create a high contact angle, etc.); retention walls or pins (e.g., arranged along opposing unit cell sides, arranged along corners of the unit cell, etc.); phase change (e.g., solidifying the working metal droplet before turning off the driver element); the driver element; and/or other retention mechanisms. Physical retention mechanisms are preferably electrically conductive (e.g., same or similar conductivity as the working metal; alternatively higher or lower), but can alternatively be electrically insulative.

The substrate stack can be hermetically sealed to control the environment within the substrate stack, and to retain the working metal within the manifolds defined between adjacent substrates in the stack. The hermetic seal preferably entirely seals the substrate stack, such that the substrate stack interior is fluidly isolated from the ambient environment, but can alternatively not entirely seal the substrate stack. The hermetic seal can include: AMOLED or OLED hermetic seal material, such as plastic, glass (e.g., glass frit, bonded glass such as wherein the hermetic seal is formed using laser encapsulation to melt and/or bond glass frit, etc.), epoxy resins, metals (e.g., using metal-to-metal bonding), ceramics, and/or other materials. However, any other suitable material can be used. The hermetic seal is preferably arranged between every adjacent substrate layer, but can additionally or alternatively be arranged between a subset of adjacent substrate layers, coat the exterior edge of the substrate stack, or be otherwise arranged. The hermetic seal can maintain: a vacuum, a reduced atmosphere, a plenum, a volume filled with gas or other material, and/or any other suitable environment within the substrate stack. Note that the system (e.g., the reservoir and/or manifold thereof) is preferably operable to compensate for changes in volume of the working metal (e.g., due to thermal expansion of solid and/or liquid metal, due to phase changes of the metal, etc.), such as including one or more compressible fluids (e.g., gasses, preferably inert gasses such as nitrogen and/or noble gasses), expansion tanks (e.g., including a moveable and/or deformable wall, such as a membrane, that isolates the environment within the substrate stack from the ambient environment, but while allowing the contained volume to change, such as change in response to expansion and/or contraction of the working metal), and/or any other suitable elements.

The substrate stack preferably defines an inter-substrate spacing. The inter-substrate spacing is preferably substantially constant along each inter-substrate gap, but can alternatively vary along the gap(s). The inter-substrate spacing is preferably substantially equal between different inter-substrate gaps of the substrate stack, but can alternatively differ between the different gaps. In some examples, the inter-substrate spacing can be 10-200 μm (e.g., 15-150 μm, such as 17 μm, 20 μm, 25 μm, 30 μm, 35 μm, 40 μm, 45 μm, 50 μm, 65 μm, 80 μm, 100 μm, 120 μm, 140 μm, 15-20 μm, 17-35 μm, 30-40 μm, 35-50 μm, 50-90 μm, 90-150 μm, etc.); however, the spacing can additionally or alternatively be less than 10 μm (e.g., 0.1-10 μm, such as 0.1-0.3 μm, 0.3-0.1 μm, 1-2 μm, 2-5 μm, 5-10 μm, etc.; less than 0.1 μm; etc.), more than 200 μm, and/or have any other suitable size.

The substrate stack can optionally include a set of spacers that control the inter-substrate spacing (e.g., control the gap height or gap width). The spacers can include: spheres (e.g., substantially the same diameter as the desired gap height, such as 17 μm, 35 μm, 40 μm, 45 μm, 50 μm, between 30-50 μm, below 30 μm, above 50 μm, etc.), protrusions (e.g., pins, walls, etc.), troughs (e.g., complimentary to the protrusions), and/or have any other suitable form factor. The spacers can be: arranged within the hermetic seal, defined along the edges of a face of one or more of the substrates, and/or be otherwise arranged. The spacers can be arranged along two opposing sides of the substrate stack, arranged along all edges of the substrate stack, and/or be otherwise arranged. However, the spacing between adjacent substrates can be achieved using etched channels, deposited structures, and/or other spacing mechanisms.

The substrate stack can define a set of manifolds, which function to fluidly connect the unit cells to the reservoir. The manifolds are preferably defined between two adjacent substrates, but can alternatively include tubes arranged within the inter-substrate gap, channels defined within the body or along the surface of a substrate, and/or be otherwise defined. In a first variant, the manifolds are formed from a series of adjacent unit cells (e.g., the manifold is subdivided into an array of unit cells). In a second variant, the manifolds are channels defined between rows of unit cells (e.g., defined by a set of walls extending along a unit cell edge). In a third variant, the manifolds are channels extending through the substrate body and fluidly connecting to each unit cell. However, the manifolds can be otherwise defined.

The manifolds can be hermetically sealed or be open to the ambient environment. The manifolds can contain inert gas, air, etchant, or other fluids, and/or any other suitable substance therein.

However, the substrate stack can be otherwise configured.

The rig can also include a set of driver elements, which function to drive working metal flow to a region adjacent to the driver element. The driver element can induce working metal flow using: electrostatics, capillary action, electro-magnetism (e.g., by applying a moving electric field, etc.), and/or using any other suitable mechanism. For example, the set of driver elements can apply a voltage across a region of the unit cell, which moves working metal to the region. In an illustrative example, a first driver element can be held at ground potential while a voltage is applied to a second driver element, which attracts and slides a droplet of working metal. In a second example, the set of driver elements can selectively change the surface charge of the substrate surface adjacent to the working metal droplet to selectively attract and/or repel the working metal droplet toward or away from a location. In a third example, the set of driver elements can apply a global, nonuniform electromagnetic field to the substrate stack, wherein the electromagnetic field is pat-terned to create the trace pattern. In a fourth example, the set of driver elements apply a moving electromagnetic field (e.g., global EM field) to a working metal droplet to move the droplet to the target location. However, the driver elements can otherwise control working metal droplet posi-tioning. Additionally or alternatively, driver elements can function as sensing components, and can measure voltage, current, resistance, capacitance, signal, and/or other electri-cal signals.

The set of driver elements can be arranged along a broad face of one or more substrates within the substrate stack (e.g., example shown in FIG. 1). In examples, driver ele-ments can be arranged: along the upper interior broad faces of each substrate, lower interior broad faces of each sub-strate, upper and lower surface of each substrate, adjacent a via (e.g., along the upper and lower surface of the substrate defining the via), and/or on any other suitable surface. The driver elements can be: mounted to the substrate, fabricated from the substrate, and/or otherwise attached to the sub-strate. The driver elements can be arranged in a regular pattern, irregular pattern, and/or in any other suitable pat-tern. The regular pattern is preferably a grid (e.g., with the same spacing as the unit cells), but can additionally or alternatively be arranged in a spiral, concentric circles, and/or in any other pattern.

Each driver element can be operably connected to a controller (e.g., a driver controller) that controls driver element operation. For example, the controller can control: when voltage is applied to the driver element, the amount of applied voltage, the frequency of voltage application, and/or other control parameters. The rig can include: one driver element for each unit cell (e.g., pixel driver), multiple driver elements for each unit cell (e.g., a positive driver element and a negative driver element, etc.), a driver element for each via (e.g., via driver), multiple driver elements for each via (e.g., a positive driver element and a negative driver element, etc.), and/or any number of driver elements.

Figure 7:
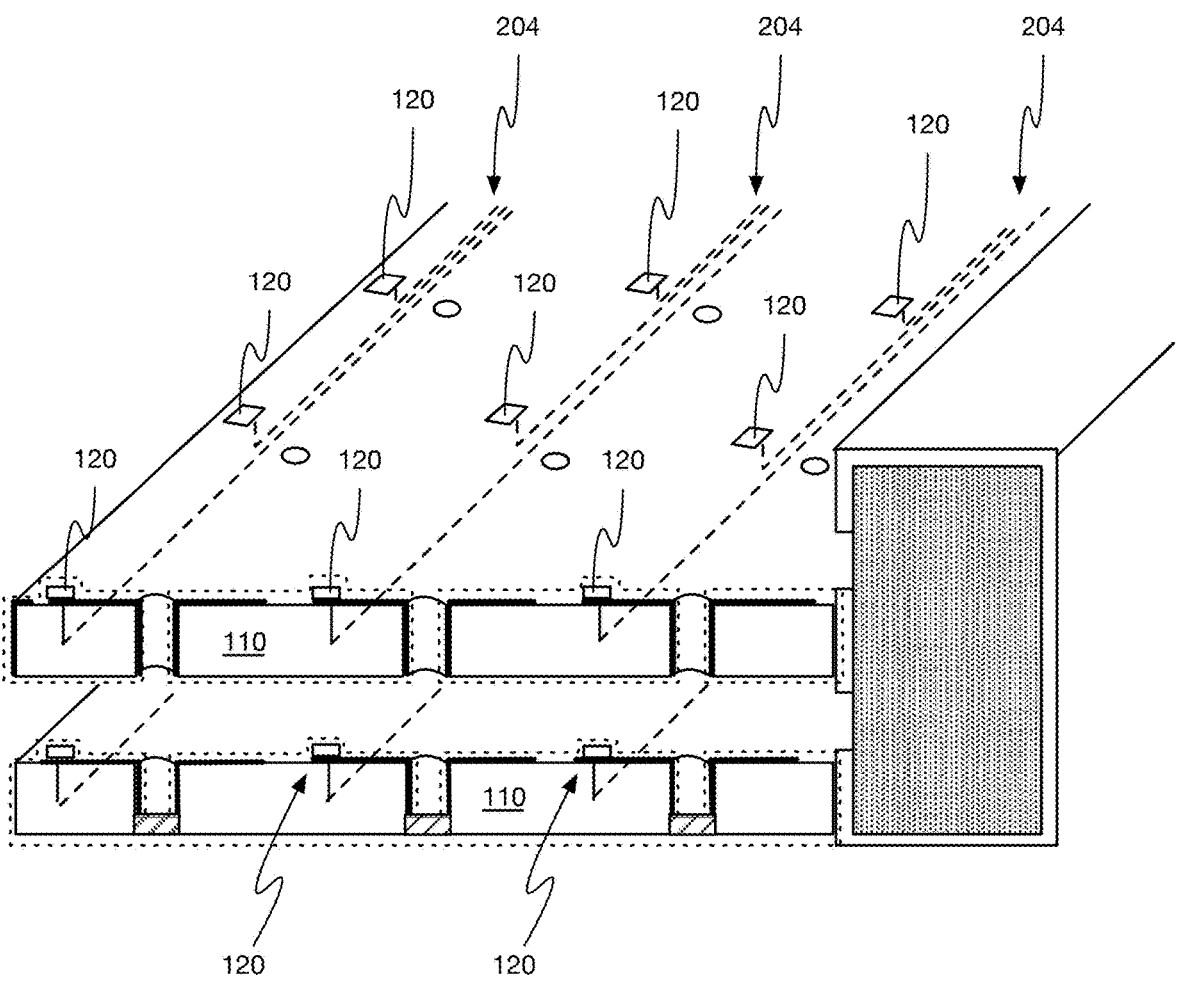
FIG. 7 is an illustrative example of drive line arrangement within the rig.

The driver elements can be connected to the driver controller by a set of drive lines 204, or otherwise connected to the controller. Each driver element preferably has an individual drive line (e.g., the drive lines are electrically isolated), but can alternatively share drive lines. A subset of driver elements can be connected in parallel or in series. In a first variant, the drive lines can extend through the body of the substrate (e.g., be embedded within the substrate); example shown in FIG. 7. In a second variant, the drive lines can extend along the substrate surface, such as in the space between pixels. However, the drive lines can be arranged in any other suitable manner.

The driver element can include one or more: transistors; capacitors; a transistor and capacitor; a combination of transistors and capacitors; a field-effect transistor (FET), such as a thin-film transistor (TFT) or metal-oxide-semicon-ductor field-effect transistor (MOSFET); an electrode; cur-rent-based driver such as a micro-LED driver; and/or any other suitable driver element. The driver element can include (e.g., be made from) one or more: semiconductor materials (e.g., silicon materials such as amorphous silicon, polycrys-talline silicon such as low-temperature polycrystalline sili-con (LTPS), etc.; metal oxides such as zinc oxide, indium gallium zinc oxide (IGZO), tin oxide, copper oxide, etc.; compound semiconductors such as cadmium selenide, metal halide perovskites, etc.; organic semiconductors; semicon-ducting carbon nanotubes; etc.), dielectric materials (e.g., silicon compounds such as silica, silicon nitride, silicon oxynitride, etc.; high-k dielectrics such as hafnia, zirconia, alumina, barium and/or strontium titanate, etc.; polymer dielectrics such as PMMA, PVA, parylene, etc.; etc.), con-ductive materials (e.g., metals; transparent conductive oxides such as ITO, FTO, AZO, ITO, etc.; graphene; metal-lic carbon nanotubes; etc.), and/or any other suitable mate-rials.

However, the driver element can be otherwise configured.

The rig can also include a set of sensing components, which function to measure electrical signals. A sensing component can measure the current, voltage, resistance, capacitance, and/or other electrical signals. The sensing component can be configured to operate in different modes, such as continuous sensing, periodic sensing, or on-demand sensing, and/or any other mode. The sensing component can include: the driver element, an electrode, a resistor, a capaci-tor, a diode, an inductor, an op-amp, be semiconductor-based sensors, be thin-film sensors, be micro-electromechanical systems (MEMS), and/or be otherwise constructed. The sensing component can be fabricated from the substrate, be a separate, integrated component, or be otherwise manufac-tured. The rig can include: a sensing component for each: unit cell, row of unit cells, set of unit cells, subcomponent of the unit cell (e.g., the pixel, the via, etc.), the reservoir, and/or any other suitable region of the rig. The sensing components are preferably connected to a controller (e.g., the same or different controller from that driving the driver elements), but can be connected to any other output. The sensing components can be connected to the controller using the: drive lines (e.g., when the driver element functions as a sensing component, when the sensing component is separate from the driver element, etc.), using auxiliary lines (e.g., extending within the body of the substrate, extending along a surface of the substrate, etc.), and/or using any other connection.

The components of the rig cooperatively form a set of unit cells, which each function to define a discrete, programmable volume that can selectively retain a working metal. In operation, a series of contiguous working metal droplets arranged in adjacent unit cells can cooperatively form an analog of a PCB trace (trace analog), wherein the rig can concurrently define multiple trace analogs to cooperatively form a PCB analog. The components of the rig (e.g., some or all components of the rig) are preferably transparent (or substantially transparent) to radio-frequency (RF) radiation (e.g., over a broad range of frequencies), which can function to minimize the components' interaction (e.g., interference) with RF signals; however, some or all components of the rig can additionally or alternatively have any other suitable RF characteristics.

The rig can define: a 2D array of unit cells (e.g., a single layer of unit cells, formed from a stack of two substrates), such as a square array, rectangular array, hexagonal array, triangular array, pentagonal array, etc.; a 3D array of unit cells (e.g., with two or more unit cell layers, formed from a stack of three or more substrates), such as a simple cubic or tetragonal array, hexagonal prism array, pentagonal prism array, triangular prism array, etc.; and/or any other suitable array of unit cells. The unit cells within the rig can be heterogeneous or homogeneous (e.g., the same size, type, dimensions, etc.). The unit cells within a layer are preferably homogeneous (e.g., the same), but can alternatively be heterogeneous. A footprint defined by each unit cell on a substrate can be square, rectangular, hexagonal, triangular, and/or have any other suitable shape. In examples, the lateral dimensions of the unit cells (e.g., dimensions of the unit cell footprint on the substrate) are preferably micron-scale (e.g., less than 10, 10, 20, 35, 50, 70, 100, 125, 150, 200, 300, 500, 10-20, 20-35, 35-50, 50-100, 100-150, 150-200, 200-300, 300-500, 500-1000, 10-35, 20-70, 70-150, and/or greater than 1000 m, etc.), more preferably sufficiently small to enable high-fidelity reproduction of typical circuit board traces (e.g., traces having thicknesses greater than 35, 50, 70, 100, 125, 150, 200, 300 and/or 500 μm, etc.; traces having arbitrary orientation within a layer; etc.); however, the lateral dimensions can additionally or alternatively be sub-micron scale (e.g., nanoscale), millimeter scale (e.g., 1-10 mm, greater than 10 mm, etc.), and/or have any other suitable dimensions.

The unit cells are preferably physically and/or electrically separated from each other (e.g., by a gap 105 in an electrically conductive substrate coating, such as ITO, examples shown in FIG. 1, FIG. 2, FIG. 3, and FIG. 4; physically separated, etc.), but can alternatively be contiguous or connected. The gap can be between 1-3 μm, or have any other size.

The unit cell can have a square or rectangular footprint, but can alternatively have any other suitable shape. The footprint can be the same for each unit cell, but can alternatively differ among unit cells. The unit cell can have a length and/or width of 150 microns (e.g., 150 microns×150 microns), 100 microns, 50 microns, 1 millimeter, 200 microns, 500 microns, between 100 microns and 1 mm, and/or have any other dimensions.

The unit cell can include: a segment of a substrate's broad surface, a volume adjacent to the substrate surface segment (e.g., above or below the substrate surface segment), optionally a segment of the substrate's thickness, a subset of the set of driver elements, and/or other portions of the rig components. The volume adjacent to the substrate can be a portion of a manifold, or be separate from the manifold. In a first variant, the unit cell includes the broad surface of a smooth substrate and the volume adjacent to the broad surface. In a second variant, the unit cell includes a via of an intermediate substrate, a broad surface of the intermediate substrate surrounding the via (e.g., upper surface, lower surface, or both), a volume adjacent to the broad surface of the intermediate substrate (e.g., upper volume, lower volume, or both, respectively). In a third variant, the unit cell includes a blind via of an outer substrate, a broad surface of the outer substrate surrounding the via, and the volume adjacent to the broad surface. However, the unit cell can be otherwise defined.

Figure 5:
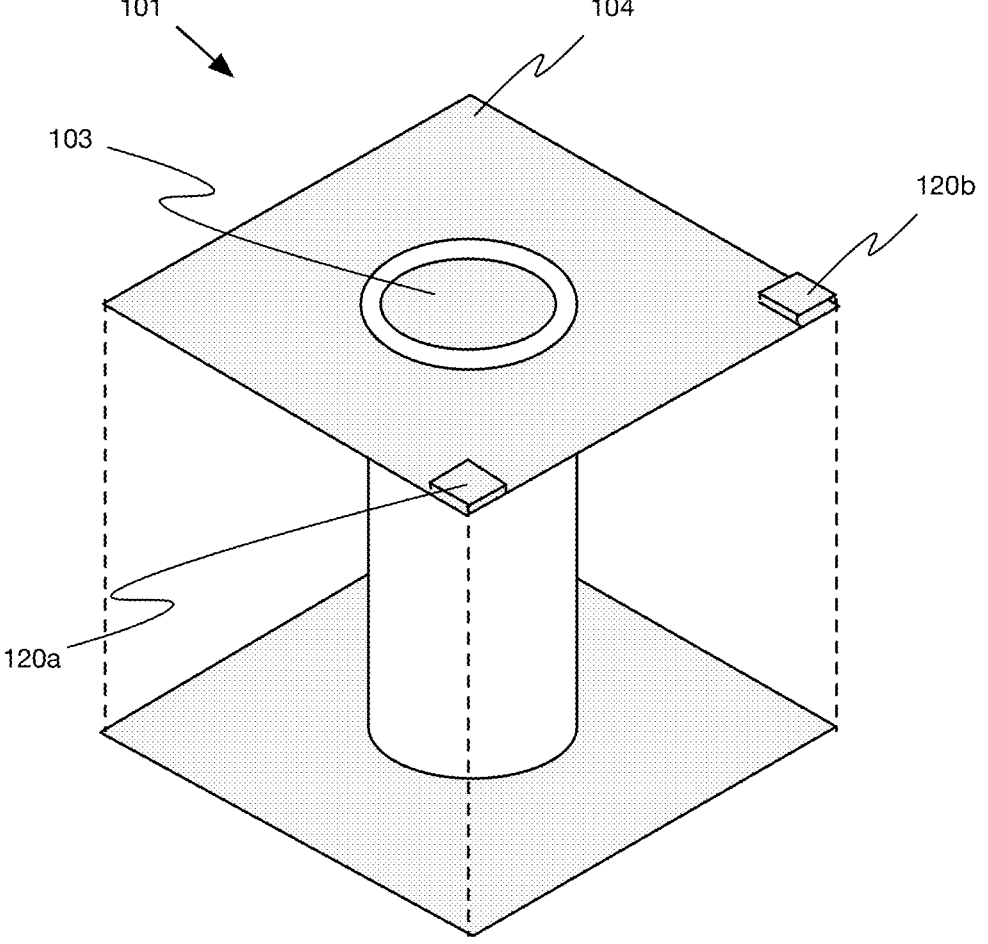
FIG. 5 is a schematic representation of an example of a unit cell.

In variants, a unit cell preferably includes a pixel 104, and can optionally include a via 103; examples shown in FIG. 1 and FIG. 5.

The pixel functions to provide a volume that can form part of a trace (e.g., part of a flat trace) in a PCB analog. The pixel (e.g., voxel) includes a portion of a substrate's broad face and the volume adjacent to the broad face, but can be otherwise defined. In an example, the pixel can include a segment of conductive material (e.g., transparent conductive material, such as indium tin oxide (ITO), fluorine-doped tin oxide (FTO), aluminum-doped zinc oxide (AZO), etc., and/or combinations thereof; any suitable conductive material, such as those described above regarding the conductive coating 111; etc.) arranged along the substrate broad face, wherein the segment is discontinuous with the conductive material segment for adjacent pixels and/or vias (e.g., electrically isolated from adjacent pixels, adjacent vias, and/or from the conductive material therewithin). The conductive material is preferably coated (in part or in whole) by one or more dielectric materials (e.g., hafnium oxide, tantalum oxide, barium strontium titanate, silicon nitride, LiF, NaF, $Al_2O_3$, $SiO_2$, $Si_3N_4$, MgO, any suitable dielectric material such as those described above regarding the dielectric coating 112, etc.), which can function to electrically isolate the conductive material from the manifold (e.g., prevent shorting between the conductive material and the working metal), but can additionally or alternatively be coated by any other suitable materials, be exposed, and/or be otherwise configured.

A unit cell preferably includes a single pixel (e.g., along the top, along the bottom, etc.), but can alternatively include two pixels (e.g., a top and bottom pixel). Each pixel can include one or more driver elements (pixel driver element 120a) from the set of driver elements, which functions to control working metal positioning (e.g., draw working metal to the pixel, retain working metal within the pixel, repel working metal from the pixel, etc.). Each pixel preferably includes a single driver element from the set of driver elements (e.g., arranged along a pixel corner, edge, center, or other region, etc.), but can alternatively include two driver elements (e.g., arranged along opposing pixel corners, edges, etc.; arranged along adjacent corners or edges, etc.), four driver elements, or any number of driver elements. The driver elements are preferably arranged distal the reservoir (e.g., on the side or corner of the pixel furthest from the reservoir), but can alternatively be arranged on the side or corner closest to the reservoir, on an orthogonal side or corner, and/or on any other side or corner.

The optional unit cell via functions to provide a volume that can form an inter-layer connection (e.g., via) in the PCB analog. The via of the unit cell includes a via defined through an intermediate substrate, but can be otherwise defined. The unit cell preferably includes a single via, but can alternatively include multiple vias. The via can be coated with a conductive material (e.g., transparent conductive material, such as indium tin oxide (ITO), fluorine-doped tin oxide (FTO), aluminum-doped zinc oxide (AZO), etc., and/or combinations thereof; metal nitrides, such as titanium nitride, tantalum nitride, zirconium nitride, hafnium nitride, vanadium nitride, etc., and/or combinations thereof; metals such as titanium, copper, and/or titanium-copper alloys; any suitable conductive material, such as those described above regarding the conductive coating 111; etc.), or be uncoated. The via coating is preferably discontinuous with the conductive material segment for adjacent pixels and/or vias (e.g., electrically isolated from adjacent pixels, adjacent vias, and/or from the conductive material therewithin, such as shown by way of example in FIG. 5), but can additionally or alternatively be electrically connected to the pixel coating and/or to any other suitable elements. The conductive material is preferably coated (in part or in whole) by one or more dielectric materials (e.g., hafnium oxide, tantalum oxide, barium strontium titanate, silicon nitride, LiF, NaF, $Al_2O_3$, $SiO_2$, $Si_3N_4$, MgO, any suitable dielectric material such as those described above regarding the dielectric coating 112, etc.), which can function to electrically isolate the conductive material from the manifold (e.g., prevent shorting between the conductive material and the working metal); but can additionally or alternatively be coated by any other suitable materials, be exposed, and/or be otherwise configured. Each via can include and/or be associated with (e.g., collocated with; arranged proximal to, such as arranged within the footprint of the same pixel as, etc.; electrically connected to; etc.) one or more driver elements (via driver element 120b) from the set of driver elements, which functions to control working metal positioning within the via (e.g., draw working metal into the via). Each via preferably includes a single driver element from the set of driver elements (e.g., arranged along a pixel corner, edge, center, or other region, etc.), but can alternatively include two driver elements (e.g., arranged on opposing sides of the via, etc.), or any number of driver elements. The via driver element can be electrically isolated from the pixel driver element, but can alternatively be electrically connected in any other suitable manner.

However, the unit cell can be otherwise configured.

The programmable circuit board can include a reservoir, which functions to provide a source and/or sink for the working metal. The reservoir is preferably fluidly connected to the set of unit cells, but can additionally or alternatively be fluidly connected to an etchant source or other source or sink. The reservoir can be connected to the set of unit cells by the set of manifolds (e.g., wherein working metal droplets are pulled through sequential unit cells, such as pixel by pixel, etc.), by a set of channels (e.g., extending through the body of a substrate, along the surface of a substrate, between unit cells, etc.), and/or otherwise connected to the unit cells; in some examples, in which many (e.g., most) unit cells of the DPCB include one or more vias, the unit cells connected to the reservoir can optionally omit such vias (e.g., wherein the unit cells function to transfer working metal between the manifold and the reservoir), but can alternatively include one or more vias and/or any other suitable features. The programmable circuit board can include one or more reservoirs. Different reservoirs can be connected the same or different unit cell layers (e.g., wherein each layer includes its own reservoir; wherein multiple layers share a reservoir; etc.), contain the same or different working metals (e.g., with different melting points, different connectivity, etc.), be located on the same or different sides of the system, and/or otherwise differ.

The reservoir can include one or more fluid control mechanisms positioned between the reservoir body and the set of unit cells that control working metal flow into the rig, and can also control the droplet size and/or other parameters of the working metal. Examples of fluid control mechanisms that can be used include: a valve (e.g., MEMS valves, solenoid valves, electrochemical actuators, etc.), a driver element that applies voltage to control fluid flow, and/or any other suitable mechanism. However, the reservoir can include any other suitable components.

However, the reservoir can be otherwise configured.

The working metal functions to dynamically form conductive features in a PCB analog. Examples of conductive features that can be formed include: traces, vias, interconnects, and/or other conductive features. One or more working metals can be used in the DPCB. The working metal can be electrically conductive. The working metal's conductivity and/or resistivity is preferably similar to copper, but can additionally or alternatively be similar to gold, aluminum, and/or other PCB trace material. The working metal preferably has a melting point above a testing temperature, but can alternatively have a melting point at or below the testing temperature. The testing temperature is preferably the temperature (or maximum temperature) at which PCB tests are run (e.g., between −40° C. to +80° C., between −55° C. to +125° C., room temperature, 20° C., 200° C., solder reflow temperature, below a solder reflow temperature by a threshold amount such as 0-100° C. less than the solder reflow temperature, etc.), but can be otherwise defined. The working metal preferably has a freezing point (e.g., solidification temperature) above the testing temperature, such that the working metal is solid during testing, but can alternatively have a freezing point below the testing temperature. In examples, the melting and/or freezing point can be about −39° C. (e.g., for mercury), about 30° C. (e.g., for gallium), about 157° C. (e.g., for indium), about 15° C. (e.g., for a eutectic gallium-indium mixture), in the range of about 15-157° C. (e.g., for a gallium-indium mixture), in the range of about 150-200° C., in the range of about 200-250° C., in the range of about 250-300° C., and/or any other suitable temperature. The working metal can include: mercury, gallium, indium, other post-transition metals, or alloys thereof, but can additionally or alternatively include any other suitable metals. A person of skill in the art will recognize that liquid metal is not a polar liquid, but rather is characterized by metallic bonding; accordingly, electrowetting (e.g., electrowetting on dielectric (EWOD)) characteristics of the working metal may differ (e.g., differ significantly) from those observed for polar liquids (e.g., water).

In operation, the working metal is liquefied (e.g., in the reservoir), and droplets of the liquid working metal are moved through the rig using the set of driver elements to the target unit cell, wherein a retention mechanism (e.g., driver elements) at the target unit cell retain the working metal droplet position. Other working metal droplets can be arranged in their target unit cells by repeating the process. The positioned working metal droplets can optionally be solidified to form a testable PCB analog (e.g., the DPCB); alternatively, the DPCB can be tested while the working metal is still in a liquid state. The working metal can be liquefied by: melting (e.g., raising the rig temperature), vibrating (e.g., applying focused ultrasound, microwaves, acoustic waves, etc.), applying electromagnetic heating, and/or otherwise liquefying the working metal. The working metal can be solidified by: lowering the rig temperature, removing an applied vibration or electromagnetic field, and/or otherwise solidifying the working metal.

In variants, the working metal can be used with one or more auxiliary materials (e.g., auxiliary fluid, such as an auxiliary liquid; in some examples, a counter-fluid), which functions to prevent the working metal from oxidizing, preserves or adjusts the working metal's electromagnetic characteristics, prevents the working metal from reacting with the substrate, controls (and/or otherwise affects) the working metal droplet's surface tension properties (e.g., to achieve a desired contact angle with the substrate, to achieve a contact angle with the substrate within a desired range of angles, to increase contact angle with the substrate above a desired minimum angle, to reduce contact angle with the substrate below a desired maximum angle, to control contact angle hysteresis with the substrate such as by achieving less than a desired maximum amount of hysteresis, etc.), and/or performs other functions. In some examples, a dielectric constant of the auxiliary material can be selected to meet one or more design goals, such as to match or substantially match a desired overall dielectric constant of the device, to contribute to bringing an average dielectric constant of the device to or toward a target value, and/or any other suitable design goals; in specific examples, the auxiliary material dielectric constant can be about 4 (e.g., 4-4.4, 3.8-4.8, etc.), such as to match a dielectric constant of a typical PCB material such as FR4, can be about 11.7 (e.g., 10-14, 11-13, 11.3-12.5, 11.5-12, etc.), such as to match a dielectric constant of silicon, can be less than 4 (e.g., 3-4, 2-3, 1-2, etc.), such as to reduce parasitic losses at high frequencies, can be greater than 4 (e.g., 4.5-5, 5-6, 6-8, 8-11, 11-14, greater than 14, etc.), and/or can have any other suitable value. The auxiliary material can be polar, non-polar, and/or have any other suitable characteristics.

In some embodiments, one or more of the auxiliary materials preferably includes (e.g., is) an etchant (e.g., which can function to remove an oxide coating on the working metal), but can additionally or alternatively include (e.g., be) a lubricant (e.g., oil, polymer, etc.), and/or other auxiliary liquid. Examples of auxiliary materials that can be used include: silicon-based materials (e.g., silicone, siloxane, etc.), silicon-based materials with acid (e.g., silicone and/or siloxane with acid), and/or any other suitable substance. The auxiliary material preferably coats the working metal (e.g., the working metal droplets, etc.), but can alternatively be mixed into the working metal (e.g., as a suspension, etc.) or otherwise interface with the working metal. The auxiliary material can be arranged within the reservoir, be injected onto a working metal droplet at a reservoir egress, be arranged within the manifold (e.g., set of fluidly connected unit cell pixels), be stored in a separate compartment within the reservoir and released as needed, be continuously present at the egress point of the reservoir, and/or be otherwise stored or released. In a first example, the working metal is immersed (e.g., completely immersed) in an auxiliary fluid (e.g., auxiliary liquid). In a second example, a small amount (e.g., less than a threshold amount, such as less than 5%, 2%, 1%, 0.5%, 0.2%, 0.1%, 0.05%, and/or 0.02% V/V, wherein the volume fraction of the auxiliary material is expressed relative to the volume of the working metal; an amount between any two of the aforementioned volume fractions; etc.) of auxiliary material (e.g., silicon-based material, such as silicone and/or siloxane, with acidic vapor) is present at (e.g., in contact with) and/or near the working fluid (e.g., in the reservoir). In a specific example, less than 0.1% V/V of an auxiliary material (e.g., including silicone with acidic vapor) is present at and/or near the working fluid (e.g., in the reservoir).

Additionally or alternatively, one or more of the auxiliary materials can include (e.g., be) a surface energy modification and/or control layer (e.g., low surface energy layer). For example, the system can include one or more surface energy modification layers, such as fluorinated layers (e.g., self-assembled monolayer presenting a fluorinated surface), on the substrate (e.g., dielectric), which can function to increase the working metal contact angle on the substrate (e.g., above a threshold value, such as a minimum desired value; to a desired value; to within a desired range; etc.), decrease working metal contact angle hysteresis on the substrate (e.g., to less than a desired maximum contact angle hysteresis) such as by reducing and/or preventing surface contamination, and/or have any other suitable functionality. For electrowetting (e.g., EWOD) applications, a higher working metal contact angle (e.g., in the absence of applied electrostatic fields) can enable electrowetting at lower applied field strengths (e.g., corresponding to lower actuation voltages), which can be advantageous in some variants of the system.

However, the system can additionally or alternatively include any other suitable auxiliary materials having any suitable compositions and/or functionalities.

In variants, the rig can be used with one or more conductive layers, which functions to electrically connect a unit cell to an external component (e.g., examples shown in FIG. 2 and FIG. 6).

In a first variant, the conductive layer can include a set of anisotropic electrical connections extending through the conductive layer thickness, wherein the anisotropic electrical connections can be electrically isolated from each other (e.g., by the bulk of the conductive layer material). The anisotropic electrical connections can be: electrically conductive coils (e.g., helices with aligned or non-intersecting axes), wires, a column of electrically conductive particulates (e.g., wherein conductive layer compression electrically connects the particulates), aligned conductor arrays (e.g., wherein conductive nanostructures, such as carbon nanotubes and/or metal nanowires, are aligned with their long axes substantially normal to a broad face of the layer), and/or otherwise formed. In examples, the conductive layer can exhibit an electrical conductivity anisotropic ratio of greater than 100 (e.g., $10^3$-$10^4$, $10^4$-$10^5$, $10^5$-$10^6$, greater than $10^6$, etc.), an in-plane resistivity of greater than $10^3$ $\Omega \cdot cm$ (e.g., $10^3$-$10^4$, $10^4$-$10^5$, $10^5$-$10^6$, greater than $10^6$ $\Omega \cdot cm$, etc.), and/or a through-plane conductivity of greater than 0.01 S/cm (e.g., 0.01-0.1, 0.1-1, 1-10, 10-100, or greater than 100 S/cm, etc.); however, the conductive layer can additionally or alternatively exhibit any suitable conductivities and/or anisotropic ratios thereof.

In a second variant, the conductive layer can include a set of patterned electrical connections, preferably connections extending normal or substantially normal to an outer broad face of the exterior substrate and/or extending through the conductive layer thickness, wherein the patterned electrical connections are preferably electrically isolated from each other (e.g., by discontinuities in the conductive layer defined between each such connection). For example, the set of patterned electrical connections can define an array (e.g., regular planar array) of islands of conductive material (e.g., on, such as deposited onto, an outer broad face of the exterior substrate). The patterned electrical connections are preferably electrically connected to the blind via caps of the rig (e.g., wherein one such electrical connection is deposited onto the conductive cap of each blind via), but can additionally or alternatively have any other suitable connectivity. In examples, the conductive layer can include: conductive paste and/or ink (e.g., metal paste and/or ink such as silver paste or ink, aluminum paste or ink, copper paste or ink, etc.; carbon-based conductive ink such as graphitic, CNT-, and/or graphene-based ink; conductive nanoparticle ink; conductive polymer such as PEDOT:PSS; etc.), such as deposited by screen printing, inkjet printing, and/or the like; deposited metal (e.g., gold, aluminum, copper, silver, platinum, nickel, tin, titanium, etc.), such as deposited via physical vapor deposition (e.g., sputtering, thermal evaporation, e-beam evaporation, etc.), electroplating, electrochemical deposition, lithographic (e.g., photolithographic) patterning, and/or the like; anisotropic conductive materials (e.g., as described above regarding the first variant); and/or any other suitable conductive materials.

However, the conductive layer can additionally or alternatively define any other suitable electrical connections, and/or be otherwise configured.

The conductive layer can be flexible, rigid, compressible, non-compressible and/or have any other suitable physical properties. For example, the conductive layer can be a gel, adhesive, and/or any other suitable material. The conductive layer can be permanently or removably attached to the rig (e.g., to an outer broad face of a substrate).

However, the conductive layer can be otherwise configured.

The electrical components (e.g., discrete electrical components) can function to model the rest of the PCB, but can alternatively function to perform any other suitable task. The electrical components are preferably the same type of electrical components (e.g., make, model, parameters, etc.) as those used to manufacture a PCB (e.g., surface mount technology (SMT), thru-hole technology (TMT), etc.), but can alternatively be different. Examples of electrical components that can be used include: chipsets, memory, interfaces (e.g., connectors), fuses, oscillators, resistors, capacitors, diodes, inductors, transistors, integrated circuits, and/or other components. Examples of interfaces that can be used include: communication interfaces (e.g., USB, ethernet, CAN, serial interfaces such as SPI or I2C, parallel interfaces, high-speed digital interfaces such as MIPI DSI, etc.), memory interfaces (e.g., SDIO), display interfaces (e.g., eDP, LVDS, etc.), and/or any other suitable interfaces.

The electrical components can be pick-and-placed based on the programmable circuit board, adhered to the DPCB, soldered to the DPCB (e.g., to the conductive layer), press-fit (e.g., onto an interposer 203 that connects to the conductive layer; into an exposed via; etc.), and/or otherwise permanently or temporarily attached to the programmable circuit board. The electrical components can be attached to the conductive layer (e.g., wherein the conductive layer is removable from the substrate) and/or attached to a substrate (e.g., via a blind via), or otherwise attached.

The electrical components can include surface mount components 202a, through hole components 202b (e.g., attached using an interposer 203 connected to the conductive layer), and/or any other suitable component type. The through hole connection can be modeled by a contiguous stack of working metal droplets arranged within the voxels and vias (e.g., a stack of filled unit cells) aligned with the interposer conductive layer connection region that electrically connect the through-hole component to an intermediate trace (e.g., example shown in FIG. 2), but can be otherwise modeled. In this example, the filled unit cells can be separated from other unit cells by a threshold number of unfilled unit cells, such that the working metal within the filled unit cells are electrically isolated from the remainder of the circuit.

The programmable circuit board can be used with a set of controllers, which function to: control working metal placement within the rig, inject signals into the resultant PCB analog, read signals out from the PCB analog, and/or perform other functionalities. In variants, the set of controllers can include: a driver controller, a board controller, and/or other controllers.

The driver controller functions to control programmable circuit board setup (e.g., control working metal placement by controlling the driver elements). The driver controller can be a display controller (e.g., OLED display controller, AMOLED display controller, LED display controller, LCD driver, etc.), ASIC, microprocessor, and/or any other controller. The driver controller can be different from or integrated into the other controllers. The driver controller can be electrically connected to and control the driver elements. For example, the driver controller can apply a voltage to a unit cell's driver element, which can attract a working metal droplet to the unit cell. In another example, the driver controller can remove or reverse the voltage applied to a unit cell's driver element, which can remove an attractive force on the working metal droplet, remove an electromagnetic field on the working metal droplet, repel the working metal droplet, and/or otherwise manipulate the working metal droplet.

In variants, the driver controller can optionally receive raw and/or low-level signals (e.g., current, resistance, voltage, etc.) from the unit cells and process the signals for higher-level interpretation.

The board controller functions to control the programmable circuit board after the PCB analog has been set up. This can enable the PCB analog to be: used as a circuit board (e.g., for computing); tested (e.g., in lieu of a fabricated PCB prototype); and/or otherwise used. The board controller can provide signals to the PCB analog, read signals from the PCB analog, and/or perform any other suitable function. In a first variant, the board controller can be directly connected to an interface (e.g., communications interface) mounted to the PCB analog. In a second variant, the board controller can be connected to the driver controller, and use the driver controller to send inputs and/or receive outputs from the PCB analog. However, the board controller can be otherwise used.

The board controller can be programmed or configured to execute test sequences, analyze results, adjust parameters based on feedback, and/or perform any other suitable task. For example, the board controller can generate and control various electrical parameters (e.g., voltage levels, frequencies, timing sequences, etc.) of the PCB analog. However, the board controller can operate in any other manner.

However, the programmable circuit board can include any other suitable set of components.

In variants, the programmable circuit board can be used with a set of testing equipment and/or test procedures to test the programmable circuit board layout, wherein the programmable circuit board can be dynamically reconfigured based on the test results. Examples of tests that can be used include: in-circuit tests, flying probe tests, functional tests, and/or other PCB layout tests. The tests can measure signals output at components mounted to the conductive layer, at the conductive layer, at an exterior surface of an outer substrate (e.g., at the blind via's cap), at a unit cell (e.g., outer unit cell, inner unit cell, etc.), and/or at any other suitable point in the programmable circuit board. Testing equipment that can be used include: an oscilloscope, a voltmeter, an ohmmeter, an ammeter, a multimeter, an LCR meter, power supplies, a signal generator, a digital pattern generator, a pulse generator, a frequency counter, test probes, a logic analyzer, a spectrum analyzer, a protocol analyzer, a vector signal analyzer, and/or any other suitable instruments, devices, or components that function to measure, analyze, or generate electrical signals.

4. Method

In some variants, the method for dynamically programming a circuit board includes: receiving a circuit board design; pixelating the traces in the circuit board design to identify target unit cell positions; positioning the working metal droplets within each target unit cell position; assembling a remainder of the circuit board components; optionally testing the assembled PCB analog; and/or optionally updating (e.g., dynamically updating) the physical PCB analog configuration by repeating any or all of the prior steps.

The circuit board design is preferably received from a remote user, but can alternatively be generated programmatically and/or using one or more statistical models (e.g., using a statistical model, such as a neural network model, trained on other PCB designs and associated characteristics and/or functionalities; using a physics model, such as a circuit model, a high-frequency electromagnetic model, a thermal model, a multiphysics model, etc.; using any other suitable model(s); etc.) to determine and/or inform determination of the design), such as generated automatically and/or in response to a user request, and/or otherwise determined. In variants, the circuit board design is only stored in volatile memory (e.g., RAM), which can prevent design theft since the design will be lost when power to the programmable circuit board is removed; in some such variants, the traces defined by the working metal are preferably also lost in response to system power loss, such as wherein the working metal has a melting temperature below ambient, and the system power is used to keep the working metal in place, such as by actively cooling the working metal below ambient temperature, retaining the working metal within target unit cells by electrowetting, and/or in any other suitable manner. However, the circuit board design can be stored in persistent memory.

The traces can be pixelated by rasterizing the circuit board design using a grid with a grid size equal (or substantially equivalent) to the unit cell size. Grid cells that overlap a trace in the circuit board design can be treated as target unit cells. The position of vias in the circuit board design can also be identified. The position of discrete electrical components (e.g., SMT components, THT components, etc.) can also be identified, wherein additional target unit cells connecting an exterior surface of the DPCB to the through-hole connection endpoint can be identified.

Positioning the working metal droplets can include: optionally heating up the DPCB and/or any suitable subset thereof, such as the working metal thereof (e.g., to melt the working metal); generating a working metal droplet from the bulk working metal (e.g., using a valve, electromagnetic fields, etc.); moving the working metal droplet to the target unit cells (e.g., as shown in FIG. 6); optionally retaining the working metal droplet in the target unit cell (e.g., while other working metal droplets are being positioned); optionally testing unit cells for working metal presence; and/or optionally cooling the DPCB and/or any suitable subset thereof, such as the working metal thereof (e.g., to solidify the working metal), wherein cooling can include actively cooling, passively cooling (e.g., allowing the working metal to cool to or toward an ambient temperature), and/or cooling in any other suitable manner. Working metal droplets can be positioned in multiple rows of unit cells (e.g., in parallel); be positioned in the unit cells row by row (e.g., serially); and/or otherwise positioned. Working metal droplets are preferably positioned in the unit cell columns furthest from the reservoir first, but can alternatively be positioned in any other order. Working metal droplets can be positioned concurrently, sequentially, and/or with any other suitable timing relative to one another. In some embodiments, working metal may already be positioned in some unit cells (e.g., corresponding to a prior circuit board design) prior to positioning. In some such embodiments, the working metal droplets can be moved directly from their previous locations to the target locations, whereas in other such embodiments, all (or substantially all) working metal is returned to the reservoir (e.g., by a process analogous to that by which the working metal droplets are directed to the target unit cells) prior to positioning the working metal droplets in the target unit cells.

In a first variation, the working metal droplets can be positioned by sequentially attracting the working metal droplets to successive adjacent unit cells until the target unit cell is reached. For example, a driver element (e.g., transistor) in the next unit cell in a droplet path (e.g., between the reservoir and the target unit cell) can be selectively controlled (e.g., turned on) to attract a working metal droplet to the next unit cell, and/or a driver element in the unit cell currently occupied by the droplet can be selectively controlled (e.g., turned off) to stop attracting and/or to repel the working metal droplet. In another example, a driver element associated with a unit cell via can be turned on to draw the droplet into the via (e.g., to form an analog of the via within the circuit board design), and/or a driver element in the unit cell currently occupied by the droplet can be selectively controlled (e.g., turned off) to stop attracting and/or to repel the working metal droplet. In a second variation, the working metal droplets can be positioned by applying an electromagnetic field to the droplet (e.g., using permanent magnets, inductive coils, etc.), and moving the electromagnetic field over the rig to move the droplet to the target unit cell. In a third variation, a stream of working metal droplets can be pulled to the target unit cells. For example, all target unit cells can be turned on (e.g., the pixel and/or via transistors for each target unit cell are turned on); working metal can be flowed through the rig, and the working metal droplets that remain attracted to the turned-on cells can cooperatively form the traces. However, the working metal droplets can be otherwise moved to the target unit cells. The working metal droplets can be retained in the target unit cells by: the driver element of the target unit cell (e.g., by applying a voltage using the transistor); the retention mechanisms of the target unit cell (e.g., the cell's walls); cooling the DPCB; and/or otherwise retained.

Testing unit cells for working metal presence can function to determine whether the working metal has been positioned correctly, such as by confirming that the target unit cells contain working metal and/or confirming that the other unit cells do not contain working metal. In one example, testing the unit cells can include measuring capacitance of the unit cells (e.g., independently measuring the capacitance of each unit cell, or of any suitable subset thereof, such as each target unit cell and/or each non-target unit cell adjacent to a target unit cell). A unit cell containing a working metal droplet will typically have significantly greater capacitance (e.g., orders of magnitude greater capacitance) than a unit cell containing no (or minimal) working metal. Accordingly, the measured capacitance values can be used to determine the actual fill state of each unit cell for which the capacitance is measured, and these actual fill states can be compared with the intended fill states. If a mismatch is detected between the actual and intended fill states, the method preferably includes controlling the driver elements to correct the detected mismatch (e.g., filling each target unit cell that is not currently filled and/or emptying each non-target unit cell that is currently filled). This testing is preferably performed while the working metal is liquid, but can additionally or alternatively be performed while the working metal is solid (e.g., wherein correcting any detected mismatch preferably includes melting the working metal before moving it) and/or with any other suitable timing.

The remainder of the circuit board components can be assembled by: attaching a conductive layer to an exterior of the DPCB, and mounting components to the conductive layer at a position corresponding to the circuit board design (e.g., using SMT, conductive adhesive, etc.).

The resultant PCB analog (design under test; DUT) can be tested using conventional testing equipment, using conventional testing methodologies. However, modified equipment and/or methodologies can be used. In variants, the signal out from the PCB analog can be corrected using a calibration that accounts for substrate misalignment (e.g., determined during initial substrate calibration).

In some examples, such as examples in which the rig includes one or more unit cells for routing connection of testing equipment (e.g., power supplies, oscilloscopes, etc.) to target nodes of the DUT (e.g., includes one or more layers including such unit cells), testing can include reconfiguring the rig to route (or re-route) some or all such connections (e.g., in a manner analogous to a test engineer relocating a test probe from one target node of the DUT to another), such as by controlling the rig to reposition working metal to the appropriate unit cells for achieving the desired test equipment connectivity (e.g., which retaining the working metal corresponding to the PCB analog in the desired positions, such as by electrostatic control, by melting only the working metal within the layers to be reconfigured while keeping the layers corresponding to the DUT frozen, etc.). However, such unit cells can additionally or alternatively be controlled in any other suitable manner.

In variants, the test results (e.g., signals, summaries, etc.) can be sent to a remote user. The results can be sent in real- or near-real time, or be sent asynchronously. In variants, the user device can include an application that: surfaces the capabilities of the PCB analog, makes the PCB analog's connection ports locally available on the user's device, simulates a local connection to the PCB analog; simulates local PCB analog testing results on the user's device, and/or performs other functionalities. In an example, local PCB analog testing results can be approximated or simulated by: forwarding the data read from the PCB analog's connectors (e.g., USB port, Ethernet port, etc.); allowing the user device to SSH into the board controller connected to the PCB analog; and/or otherwise providing the test results to the remote user.

The method (and/or any suitable elements thereof) can be repeated for new circuit board designs. In variants, the new circuit board designs can be generated by the user (e.g., based on the test results) and/or by other users, can be generated programmatically and/or by one or more statistical models (e.g., generating modifications of a prior design, such as based on the test results; generating a design based on one or more design criteria; etc.), and/or can be generated in any suitable manner and/or by any suitable entities. For example, a new set of target unit cells can be determined from the new circuit board design; the DPCB can be heated above the working metal melting temperature; the working metal droplets can be moved back to the reservoir and/or to their new positions (e.g., by controlling the driver elements to achieve such movement); and the DPCB can be cooled to set the new PCB analog.

All or portions of the method can be performed in real time (e.g., responsive to a request), iteratively, concurrently, asynchronously, periodically, and/or at any other suitable time. All or portions of the method can be performed automatically, manually, semi-automatically, and/or otherwise performed.

5. Specific Examples

A numbered list of specific examples of the technology described herein are provided below. A person of skill in the art will recognize that the scope of the technology is not limited to and/or by these specific examples.

1. A programmable circuit board system comprising:
a substrate defining a first surface;
an array of electrical control cells defined at the substrate;
a dielectric, the dielectric coating at least some of the first surface; and
a working metal;
wherein:
the system defines an array of pixels, wherein each pixel of the array of pixels comprises:
a respective substrate portion of the substrate comprising a respective surface portion of the first surface;
a respective electrical control cell of the array of electrical control cells, the respective electrical control cell defined at the respective portion of the substrate; and
a respective dielectric portion of the dielectric, the respective dielectric portion coating the respective surface portion; and
the system is operable to:
receive a map indicative of a plurality of conductor pixels selected from the array of pixels; and
configure the working metal based on the map, comprising controlling the array of electrical control cells such that, for each conductor pixel of the plurality: a respective working metal portion of the working metal moves to the conductor pixel due to electrowetting forces such that the respective working metal portion contacts the respective dielectric portion.

2. The system of Specific Example 1, wherein the system is further operable to configure the working metal based on the map such that, while each conductor pixel of the plurality contains the respective working metal portion contacting the respective dielectric portion, for each conductor pixel of the plurality:
the conductor pixel is adjacent to each pixel of a respective set of adjacent conductor pixels of the plurality of conductor pixels and to each pixel of a respective set of adjacent non-conductor pixels of the array of pixels, wherein the set intersection of the respective set of adjacent non-conductor pixels and the plurality of conductor pixels is empty;
for each adjacent conductor pixel of the respective set, the respective working metal portion of the conductor pixel electrically contacts the respective working metal portion of the adjacent conductor pixel; and for each adjacent non-conductor pixel of the respective set, the respective working metal portion of the conductor pixel does not electrically contact the adjacent non-conductor pixel.

3. The system of Specific Example 1 or 2, wherein the system is further operable to:

receive a second map indicative of a second plurality of conductor pixels selected from the array of pixels, the second plurality of conductor pixels different from the plurality of conductor pixels; and after configuring the working metal based on the map, configure the working metal based on the second map, comprising controlling the array of electrical control cells such that, for each conductor pixel of the second plurality: a respective working metal portion of the working metal moves to the conductor pixel due to electrowetting forces such that the respective working metal portion contacts the respective dielectric portion.

4. The system of any of the preceding Specific Examples, wherein:

the substrate defines a second side opposing the first side across the substrate;

the substrate comprises an electrical insulator;

the system further comprises a plurality of discrete electrical components; and each discrete electrical component of the plurality is electrically and mechanically connected to the second side.

5. The system of Specific Example 4, wherein:

each discrete electrical component of the plurality is mechanically connected to the second side by solder; and a working metal melting temperature of the working metal is less than a solder melting temperature of the solder.

6. The system of Specific Example 4 or 5, wherein a working metal melting temperature of the working metal is greater than an ambient temperature of an environment surrounding the system.

7. The system of any of Specific Examples 4-6, further comprising an anisotropic conductive layer coating the second surface, wherein:

each discrete electrical component of the plurality is electrically connected to the anisotropic conductive layer;

the anisotropic conductive layer exhibits a through-plane electrical conductivity normal to the second surface;

the anisotropic conductive layer exhibits an in-plane electrical conductivity parallel to the second surface;

the through-plane electrical conductivity is at least ten times greater than the in-plane electrical conductivity;

the substrate defines a plurality of blind vias penetrating the first surface, wherein each blind via of the plurality:

is arranged within a different pixel of the array;

defines a respective entry aperture at the first surface, a respective terminal surface within the substrate, and a respective sidewall extending between the entry aperture and the terminal surface; and comprises a respective conductive cap defining the respective terminal surface, the respective conductive cap electrically connecting the respective terminal surface to the anisotropic conductive layer;

the plurality of blind vias comprises a first blind via, the first blind via comprising a first conductive cap;

the plurality of discrete electrical components comprises a first component arranged across the anisotropic conductive layer from the first conductive cap, wherein a reference axis normal to the second surface intersects the first conductive cap and intersects an electrical conductor of the first component; and configuring the working metal based on the map further comprises controlling the array of electrical control cells such that a first via portion of the working metal contacts the first conductive cap, thereby electrically connecting the first component to the first via portion of the working metal.

8. The system of any of the preceding Specific Examples, wherein:

the array of electrical control cells comprises a non-insulating material deposited on the first surface; and the dielectric coats the non-insulating material.

9. The system of Specific Example 8, wherein the working metal is electrically isolated from the non-insulating material by the dielectric, wherein the working metal, the non-insulating material, and the dielectric cooperatively define a capacitor.

10a. The system of any of the preceding Specific Examples, wherein the array of electrical control cells is a regular array.

10b. The system of any of the preceding Specific Examples, wherein the array of electrical control cells is an irregular array.

11. The system of any of the preceding Specific Examples, wherein:

the substrate defines an array of vias at the first surface;

the system further comprises an array of via electrical control cells, wherein each via electrical control cell of the array of via electrical control cells is arranged proximal to a respective via of the array of vias;

the dielectric coats at least some of each via of the array;

the map is further indicative of a plurality of conductor vias selected from the array of vias; and configuring the working metal based on the map further comprises controlling the array of electrical control cells and the array of via electrical control cells such that, for each conductor via of the plurality: a respective working metal portion of the working metal moves to the conductor via due to electrowetting forces such that the respective working metal portion substantially fills the conductor via.

12a. The system of Specific Example 11, further comprising:

a second substrate arranged substantially parallel to the first substrate, wherein the second surface is arranged between the second substrate and the first surface;

a second array of electrical control cells defined at the second substrate; and a second dielectric, the second dielectric coating at least some of the second surface;

wherein:

the system further defines a second array of pixels, wherein each pixel of the second array of pixels comprises:

a respective substrate portion of the second substrate;

a respective electrical control cell of the second array of electrical control cells, the respective electrical control cell defined at the respective portion of the second substrate; and a respective dielectric portion of the second dielectric, the respective dielectric portion coating the respective surface portion;

the dielectric is fluidly coupled to the second dielectric via the array of vias;

the map is further indicative of a second plurality of conductor pixels selected from the second array of pixels; and configuring the working metal based on the map further comprises controlling the second array of electrical control cells such that, for each conductor pixel of the second plurality: a respective working metal portion of the working metal moves to the conductor pixel due to electrowetting forces such that the respective working metal portion contacts the respective dielectric portion.

12b. The system of Specific Example 12a, further comprising:

a third substrate arranged substantially parallel to the second substrate, wherein the second substrate is arranged between the third substrate and the first substrate;

a third array of electrical control cells defined at the third substrate; and a third dielectric, the third dielectric coating at least some of the third surface;

wherein:

the substrate further defines a second array of vias through the second substrate;

the system further comprises a second array of via electrical control cells, wherein each via electrical control cell of the second array of via electrical control cells is arranged proximal to a respective via of the second array of vias;

the second dielectric coats at least some of each via of the second array;

the system further defines a third array of pixels, wherein each pixel of the third array of pixels comprises:

a respective substrate portion of the third substrate;

a respective electrical control cell of the third array of electrical control cells, the respective electrical control cell defined at the respective portion of the third substrate; and a respective dielectric portion of the third dielectric, the respective dielectric portion coating the respective surface portion;

the third dielectric is fluidly coupled to the second dielectric via the second array of vias;

the map is further indicative of a second plurality of conductor vias selected from the second array of vias and of a third plurality of conductor pixels selected from the third array of pixels; and configuring the working metal based on the map further comprises controlling the second array of electrical control cells, the second array of via electrical control cells, and the third array of electrical control cells such that:

for each conductor via of the second plurality: a respective working metal portion of the working metal moves to the conductor via due to electrowetting forces such that the respective working metal portion substantially fills the conductor via; and for each conductor pixel of the third plurality: a respective working metal portion of the working metal moves to the conductor pixel due to electrowetting forces such that the respective working metal portion contacts the respective dielectric portion.

13a. The system of any of Specific Examples 11, 12a, or 12b, wherein:

the substrate comprises glass having a dielectric constant greater than 5; and an effective metamaterial dielectric constant cooperatively defined by the substrate and the array of vias is between about 4 and about 4.4.

13b. The system of any of the preceding Specific Examples, wherein the substrate has a dielectric constant greater than 5.5.

13c. The system of any of the preceding Specific Examples, wherein the substrate has a dielectric constant of about 6.

14. The system of any of the preceding Specific Examples, wherein the system further defines a reservoir interior fluidly coupled to the first surface, the reservoir interior containing at least a portion of the working metal, wherein the system is operable to control the array of electrical control cells such that portions of the working metal move between the reservoir interior and the array of pixels.

15. The system of Specific Example 14, wherein the reservoir interior is fluidly isolated from an ambient environment surrounding the system.

16a. The system of Specific Example 14 or 15, wherein the reservoir interior further contains an auxiliary material.

16b. The system of Specific Example 16a, wherein the auxiliary material comprises an acidic counter-fluid.

16c. The system of Specific Example 16a or 16b, wherein the auxiliary material comprises a silicon-based material.

16d. The system of Specific Example 16c, wherein the silicon-based material comprises at least one of: silicone or siloxane.

16e. The system of any of Specific Examples 16a-16d, wherein the auxiliary material comprises an acid.

17a. The system of any of the preceding Specific Examples, wherein the dielectric comprises a metal oxide comprising at least one of: hafnium, tantalum, barium, or strontium.

17b. The system of Specific Example 17a, wherein the metal oxide comprises hafnium oxide.

17c. The system of Specific Example 17a or 17b, wherein the metal oxide comprises tantalum oxide.

17c. The system of any of Specific Examples 17a-17c, wherein the metal oxide comprises barium strontium titanate.

18a. The system of any of the preceding Specific Examples, wherein the working metal comprises gallium.

18b. The system of any of the preceding Specific Examples, wherein the working metal comprises indium.

18c. The system of Specific Example 18b, wherein the working metal consists essentially of indium.

19. The system of any of the preceding Specific Examples, further comprising a fluorinated layer that coats the dielectric.

20. The system of any of the preceding Specific Examples, wherein configuring the working metal based on the map further comprises melting at least some of the working metal.

21a. The system of any of the preceding Specific Examples, wherein each electrical control cell comprises a respective transistor.

21b. The system of Specific Example 21a, wherein, for each electrical control cell, the respective transistor is a thin-film transistor (TFT).

22. The system of Specific Example 21b, wherein, for each pixel of the array of pixels, the respective TFT is deposited on the respective surface portion.

23. The system of any of the preceding Specific Examples, wherein each electrical control cell comprises a respective conductive pad.

24. The system of Specific Example 23, wherein the respective conductive pad of each electrical control cell comprises a transparent conducting film.

25. A method comprising, at the system of any of the preceding Specific Examples, configuring the working metal based on the map, comprising controlling the array of electrical control cells.

26. The method of Specific Example 25, wherein configuring the working metal based on the map further comprises melting at least a portion of the working metal.

27. The method of Specific Example 25 or 26, further comprising, after configuring the working metal based on the map, while the working metal is configured based on the map, allowing the working metal to solidify.

28. The method of any of Specific Examples 25-27, further comprising, before configuring the working metal based on the map, soldering a plurality of discrete electrical components to the system.

29. A method comprising:
determining a trace map indicative of a plurality of target pixels of an array of pixels; and
configuring a working metal based on the trace map, comprising, for each target pixel of the plurality: via electrowetting, controlling a respective portion of the working metal to occupy the target pixel.

30. The method of Specific Example 29, wherein, for each target pixel of the plurality, controlling the respective portion of the working metal to occupy the target pixel comprises controlling the respective portion to move through the array of pixels to the target pixel via sequential application of electrowetting forces.

31. The method of Specific Example 29 or 30, further comprising, for each target pixel of the plurality, before controlling the respective portion of the working metal to occupy the target pixel, melting the respective portion of the working metal.

32. The method of any of Specific Examples 29-31, further comprising, for each target pixel of the plurality, after controlling the respective portion of the working metal to occupy the target pixel, solidifying the respective portion of the working metal.

33. The method of any of Specific Examples 29-32, further comprising electrically connecting a plurality of discrete electrical components to the working metal.

34. The method of any of Specific Examples 29-33, further comprising receiving a circuit board specification indicative of a plurality of traces, wherein determining the trace map is performed based on the circuit board specification.

35. The method of any of Specific Examples 29-34, further comprising:
determining a second trace map indicative of a second plurality of target pixels of the array of pixels; and
configuring the working metal based on the trace map, configuring the working metal based on the second trace map, comprising, for each target pixel of the second plurality: via electrowetting, controlling a respective portion of the working metal to occupy the target pixel.

35. The method of any of Specific Examples 29-34, further comprising:
communicatively connecting a computer to the working metal;
receiving electrical signals via the working metal; and
providing information indicative of the electrical signals via the computer.

36. The method of any of Specific Examples 29-35, performed using the system of any of Specific Examples 1-24.

All references cited herein are incorporated by reference in their entirety, except to the extent that the incorporated material is inconsistent with the express disclosure herein, in which case the language in this disclosure controls.

As used herein, "substantially" or other words of approximation can be within a predetermined error threshold or tolerance of a metric, component, or other reference, and/or be otherwise interpreted.

Optional elements, which can be included in some variants but not others, are indicated in broken line in the figures. However, unbroken lines in the figures should not be interpreted to indicate that the depicted elements are essential or may not be omitted from variants of the invention.

Different subsystems and/or modules discussed above can be operated and controlled by the same or different entities. In the latter variants, different subsystems can communicate via: APIs (e.g., using API requests and responses, API keys, etc.), requests, and/or other communication channels. Communications between systems can be encrypted (e.g., using symmetric or asymmetric keys), signed, and/or otherwise authenticated or authorized.

Alternative embodiments implement the above methods and/or processing modules in non-transitory computer-readable media, storing computer-readable instructions that, when executed by a processing system, cause the processing system to perform the method(s) discussed herein. The instructions can be executed by computer-executable components integrated with the computer-readable medium and/or processing system. The computer-readable medium may include any suitable computer readable media such as RAMs, ROMs, flash memory, EEPROMs, optical devices (CD or DVD), hard drives, floppy drives, non-transitory computer readable media, or any suitable device. The computer-executable component can include a computing system and/or processing system (e.g., including one or more collocated or distributed, remote or local processors) connected to the non-transitory computer-readable medium, such as CPUs, GPUs, TPUS, microprocessors, or ASICs, but the instructions can alternatively or additionally be executed by any suitable dedicated hardware device.

Embodiments of the system and/or method can include every combination and permutation of the various system components and the various method processes, wherein one or more instances of the method and/or processes described herein can be performed asynchronously (e.g., sequentially), contemporaneously (e.g., concurrently, in parallel, etc.), or in any other suitable order by and/or using one or more instances of the systems, elements, and/or entities described herein. Components and/or processes of the following system and/or method can be used with, in addition to, in lieu of, or otherwise integrated with all or a portion of the systems and/or methods disclosed in the applications mentioned above, each of which are incorporated in their entirety by this reference.

The FIGURES illustrate the architecture, functionality and operation of possible implementations of systems, methods and computer program products according to preferred embodiments, example configurations, and variations thereof. In this regard, each block in the flowchart or block diagrams may represent a module, segment, step, or portion of code, which comprises one or more executable instructions for implementing the specified logical function(s). It should also be noted that, in some alternative implementations, the functions noted in the block can occur out of the order noted in the FIGURES. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

As a person skilled in the art will recognize from the previous detailed description and from the figures and claims, modifications and changes can be made to the preferred embodiments of the invention without departing from the scope of this invention defined in the following claims.

We claim:

1. A programmable circuit board system comprising:
a substrate including a first surface;
an array of electrical control cells arranged at the substrate;
a dielectric, the dielectric coating at least some of the first surface; and
a working metal;
wherein:
the system comprises an array of pixels, wherein each pixel of the array of pixels comprises:
a respective substrate portion of the substrate comprising a respective surface portion of the first surface;
a respective electrical control cell of the array of electrical control cells, the respective electrical control cell arranged at the respective portion of the substrate; and
a respective dielectric portion of the dielectric, the respective dielectric portion coating the respective surface portion; and
the system is operable to:
receive a map indicative of a plurality of conductor pixels selected from the array of pixels; and
configure the working metal based on the map, comprising controlling the array of electrical control cells such that, for each conductor pixel of the plurality: a respective working metal portion of the working metal moves to the conductor pixel due to electrowetting forces such that the respective working metal portion contacts the respective dielectric portion.

2. The system of claim 1, wherein the system is further operable to configure the working metal based on the map such that, while each conductor pixel of the plurality contains the respective working metal portion contacting the respective dielectric portion, for each conductor pixel of the plurality:
the conductor pixel is adjacent to each pixel of a respective set of adjacent conductor pixels of the plurality of conductor pixels and to each pixel of a respective set of adjacent non-conductor pixels of the array of pixels, wherein the set intersection of the respective set of adjacent non-conductor pixels and the plurality of conductor pixels is empty;
for each adjacent conductor pixel of the respective set, the respective working metal portion of the conductor pixel electrically contacts the respective working metal portion of the adjacent conductor pixel; and for each adjacent non-conductor pixel of the respective set, the respective working metal portion of the conductor pixel does not electrically contact the adjacent non-conductor pixel.

3. The system of claim 1, wherein the system is further operable to:
receive a second map indicative of a second plurality of conductor pixels selected from the array of pixels, the second plurality of conductor pixels different from the plurality of conductor pixels; and
after configuring the working metal based on the map, configure the working metal based on the second map, comprising controlling the array of electrical control cells such that, for each conductor pixel of the second plurality: a respective working metal portion of the working metal moves to the conductor pixel due to electrowetting forces such that the respective working metal portion contacts the respective dielectric portion.

4. The system of claim 1, wherein:
the substrate includes a second surface opposing the first surface across the substrate;
the substrate comprises an electrical insulator;
the system further comprises a plurality of discrete electrical components; and
each discrete electrical component of the plurality is electrically and mechanically connected to the second surface.

5. The system of claim 4, wherein a working metal melting temperature of the working metal is less than 200° C.

6. The system of claim 5, wherein the working metal melting temperature is greater than an ambient temperature of an environment surrounding the system.

7. The system of claim 4, further comprising:
an anisotropic conductive layer coating the second surface;
a plurality of blind vias; and
for each blind via of the plurality: a respective conductive cap associated with the blind via, the respective conductive cap including a respective terminal surface arranged within the blind via;
wherein:
each discrete electrical component of the plurality is electrically connected to the anisotropic conductive layer;
the anisotropic conductive layer exhibits a through-plane electrical conductivity normal to the second surface;
the anisotropic conductive layer exhibits an in-plane electrical conductivity parallel to the second surface;
the through-plane electrical conductivity is at least ten times greater than the in-plane electrical conductivity;
for each blind via of the plurality:
the blind via is arranged within a different pixel of the array;
the substrate includes a respective via sidewall extending between a respective entry aperture of the blind via and the respective terminal surface; and
the respective conductive cap electrically connect s the respective terminal surface to the anisotropic conductive layer;
the plurality of blind vias comprises a first blind via, the first blind via associated with a first conductive cap;
the plurality of discrete electrical components comprises a first component arranged across the anisotropic conductive layer from the first conductive cap, wherein a reference axis normal to the second surface intersects the first conductive cap and intersects an electrical conductor of the first component; and configuring the working metal based on the map further comprises controlling the array of electrical control cells such that a first via portion of the working metal contacts the first conductive cap, thereby electrically connecting the first component to the first via portion of the working metal.

8. The system of claim 1, wherein:

the array of electrical control cells comprises a non-insulating material deposited on the first surface; and the dielectric coats the non-insulating material.

9. The system of claim 8, wherein the working metal is electrically isolated from the non-insulating material by the dielectric, wherein the working metal, the non-insulating material, and the dielectric cooperatively form a capacitor.

10. The system of claim 1, wherein the array of electrical control cells is a regular array.

11. The system of claim 1, wherein:

the system further comprises:

an array of vias arranged at the first surface of the substrate, each via of the array bounded by the first surface; and an array of via electrical control cells, wherein each via electrical control cell of the array of via electrical control cells is arranged proximal to a respective via of the array of vias;

the dielectric coats at least some of each via of the array;

the map is further indicative of a plurality of conductor vias selected from the array of vias; and configuring the working metal based on the map further comprises controlling the array of electrical control cells and the array of via electrical control cells such that, for each conductor via of the plurality: a respective working metal portion of the working metal moves to the conductor via due to electrowetting forces such that the respective working metal portion substantially fills the conductor via.

12. The system of claim 11, further comprising:

a second substrate arranged substantially parallel to the first substrate, wherein a second surface of the substrate is arranged between the second substrate and the first surface;

a second array of electrical control cells arranged at the second substrate; and a second dielectric, the second dielectric coating at least some of the second surface;

wherein:

the system further comprises a second array of pixels, wherein each pixel of the second array of pixels comprises:

a respective substrate portion of the second substrate;

a respective electrical control cell of the second array of electrical control cells, the respective electrical control cell arranged at the respective portion of the second substrate; and a respective dielectric portion of the second dielectric, the respective dielectric portion coating the respective surface portion;

the dielectric is fluidly coupled to the second dielectric via the array of vias;

the map is further indicative of a second plurality of conductor pixels selected from the second array of pixels; and configuring the working metal based on the map further comprises controlling the second array of electrical control cells such that, for each conductor pixel of the second plurality: a respective working metal portion of the working metal moves to the conductor pixel due to electrowetting forces such that the respective working metal portion contacts the respective dielectric portion.

13. The system of claim 11, wherein:

the substrate comprises glass having a dielectric constant greater than 5; and a metamaterial consisting essentially of the substrate and the array of vias has an effective metamaterial dielectric constant between about 4 and about 4.4.

14. The system of claim 1, wherein the system further comprises a reservoir interior fluidly coupled to the first surface, the reservoir interior containing at least a portion of the working metal, wherein the system is operable to control the array of electrical control cells such that portions of the working metal move between the reservoir interior and the array of pixels.

15. The system of claim 14, wherein the reservoir interior is fluidly isolated from an ambient environment surrounding the system.

16. The system of claim 15, wherein the reservoir interior further contains an acidic counter-fluid.

17. The system of claim 1, wherein the dielectric comprises a metal oxide comprising at least one of: hafnium, tantalum, barium, or strontium.

18. The system of claim 1, wherein the working metal comprises at least one of: indium or gallium.

19. The system of claim 1, further comprising a fluorinated layer that coats the dielectric.

20. The system of claim 1, wherein configuring the working metal based on the map further comprises melting at least some of the working metal.

* * * * *